(12) United States Patent
Wang et al.

(10) Patent No.: US 12,261,464 B2
(45) Date of Patent: Mar. 25, 2025

(54) HIGH VOLTAGE DEVICE BUILT FROM MODULAR LOW VOLTAGE DEVICES AND OPERATION METHODS THEREOF

(71) Applicant: Delta Electronics, Inc., Taipei (TW)

(72) Inventors: Ruxi Wang, Cary, NC (US); Zhiyu Shen, Cary, NC (US); Chi Zhang, Apex, NC (US); Tomas Sadilek, Cary, NC (US); Peter Mantovanelli Barbosa, Cary, NC (US)

(73) Assignee: Delta Electronics, Inc., Taipei (TW)

( * ) Notice: Subject to any disclaimer, the term of this patent is extended or adjusted under 35 U.S.C. 154(b) by 496 days.

(21) Appl. No.: 17/483,518

(22) Filed: Sep. 23, 2021

(65) Prior Publication Data

US 2022/0344946 A1 Oct. 27, 2022

Related U.S. Application Data

(60) Provisional application No. 63/179,805, filed on Apr. 26, 2021.

(51) Int. Cl.
*H02J 7/00* (2006.01)
*H03K 17/687* (2006.01)

(52) U.S. Cl.
CPC .......... *H02J 7/0014* (2013.01); *H02J 7/0048* (2020.01); *H03K 17/6871* (2013.01)

(58) Field of Classification Search
CPC .......... H02J 7/0014; H02J 7/0048; H02J 3/36; H03K 17/6871; H02M 7/4833; H02M 7/4835; H02M 7/483; H02M 7/219
See application file for complete search history.

(56) References Cited

U.S. PATENT DOCUMENTS

| 9,525,348 B1 | 12/2016 | Aeloiza et al. |
| 2016/0072375 A1* | 3/2016 | Zhou ................ H02M 3/33569 363/21.1 |
| 2019/0115849 A1 | 4/2019 | Gotz |

FOREIGN PATENT DOCUMENTS

| CN | 109361214 B | 2/2019 |
| CN | 111245246 A | 6/2020 |
| CN | 111564886 A | 8/2020 |
| CN | 112005498 A | 11/2020 |

(Continued)

OTHER PUBLICATIONS

I. A. Gowaid et al., "Quasi Two-Level Operation of Modular Multilevel Converter for Use in a High-Power DC Transformer with DC Fault Isolation capability", DOI 10.1109/TPEL.2014.2306453, IEEE Transactions on Power Electronics.

(Continued)

*Primary Examiner* — Metasebia T Retebo
(74) *Attorney, Agent, or Firm* — KIRTON McCONKIE; Evan R. Witt

(57) ABSTRACT

The present disclosure provides a high voltage device built from modular low voltage cells. Each low voltage cell includes a plurality of low voltage semiconductor devices and one or more low voltage passive components. Each cell can be a current-bidirectional two-quadrant switch or a four-quadrant switch. All the cells may be identical and controlled with a delay time in between. Therefore, the total on and off time of the high voltage device can be controlled to reduce the output equivalent dv/dt. The cell's voltage balancing can be achieved through a control algorithm disclosed herein.

16 Claims, 17 Drawing Sheets

(56) References Cited

FOREIGN PATENT DOCUMENTS

| WO | 2012033958 A1 | 3/2012 |
| WO | 2016092091 A1 | 6/2016 |
| WO | 2019063078 A1 | 4/2019 |

OTHER PUBLICATIONS

L. Zheng et al., "SiCBased 5 kV Universal Modular Soft-Switching Solid-State Transformer (M-S4T) for Medium-Voltage DC Microgrids and Distribution Grids", DOI 10.1109/TPEL.2021.3066908, IEEE Transactions on Power Electronics.

R. Chattopadhyay et al., "Low-Voltage PV Power Integration into medium voltage grid using high-voltage SiC devices", the 2014 International Power Electronics Conference.

S. Sabri et al., "New generation 6.5 kV SiC power MOSFET," 2017 IEEE 5th Workshop on Wide Bandgap Power Devices and Applications (WiPDA), Albuquerque, NM, 2017, pp. 246-250.

V. Pala et al., "10 kV and 15 KV silicon carbide power MOSFETs for next-generation energy conversion and transmission systems," 2014 IEEE Energy Conversion Congress and Exposition (ECCE), Pittsburgh, PA, 2014, pp. 449-454.

A. Bolotnikov et al., "Overview of 1.2kV-2.2kV SiC MOSFETs targeted for industrial power conversion applications," 2015 IEEE Applied Power Electronics Conference and Exposition (APEC), Charlotte, NC, 2015, pp. 2445-2452, doi: 10.1109/APEC.2015.7104691.

J. L. Hostetler, P. Alexandrov, X. Li, L. Fursin and A. Bhalla, "6.5 kV SiC normally-off JFETs—Technology status," 2014 IEEE Workshop on Wide Bandgap Power Devices and Applications, Knoxville, TN, 2014, pp. 143-146.

A. Bolotnikov, et al. "SiC Charge-Balanced Devices Offering Breakthrough Performance Surpassing the 1-D Ron Versus BV Limit", ECSCRM 2018.

K. Vechalapu, S. Bhattacharya and E. Aleoiza, "Performance evaluation of series connected 1700V SiC MOSFET devices," 2015 IEEE 3rd Workshop on Wide Bandgap Power Devices and Applications (WiPDA), Blacksburg, VA, 2015, pp. 184-191.

L. Zhang, S. Sen, Z. Guo, X. Zhao, A. Q. Huang and X. Song, "7.2-kV/60-A Austin SuperMOS: An Enabling SiC Switch Technology for Medium Voltage Applications," 2019 IEEE Electric Ship Technologies Symposium (ESTS), Washington, DC, USA, 2019, pp. 523-529, doi: 10.1109/ESTS.2019.8847863.

X. Song, A. Q. Huang, S. Sen, L. Zhang, P. Liu and X. Ni, "15-kV/40-A FREEDM Super-cascode: A Cost-Effective SiC High-Voltage and High-Frequency Power Switch," in IEEE Transactions on Industry Applications, vol. 53, No. 6, pp. 5715-5727, Nov.-Dec. 2017.

B. Gao, A. J. Morgan, Y. Xu, X. Zhao and D. C. Hopkins, "6.0kV, 100A, 175kHz super cascode power module for medium voltage, high power applications," 2018 IEEE Applied Power Electronics Conference and Exposition (APEC), San Antonio, TX, 2018, pp. 1288-1293.

Raszmann, Emma Barbara, "Series-Connection of Silicon Carbide MOSFET Modules using Active Gate-Drivers with dv/dt Control," 2019 Master Thesis.

Xiang Lin, "Active Voltage Balancing for Series-Connected 10KV SiC MOSFETs," WBG-HPCS Review Q3-2019.

P. Wang, F. Gao, Y. Jing, Q. Hao, K. Li and H. Zhao, "An Integrated Gate Driver with Active Delay Control Method for Series Connected SiC MOSFETs," 2018 IEEE 19th Workshop on Control and Modeling for Power Electronics (COMPEL), Padua, 2018, pp. 1-6.

P. Czyz, P. Papamanolis, T. Guillod, F. Krismer and J. W. Kolar, "New 40KV / 300KVA Quasi-2-Level Operated 5-Level Flying Capacitor SiC "Super-Switch" IPM," 2019 10th International Conference on Power Electronics and ECCE Asia (ICPE 2019—ECCE Asia), Busan, Korea (South), 2019, pp. 813-820.

I. A. Gowaid, G. P. Adam, A. M. Massoud, S. Ahmed, D. Holliday and B. W. Williams, "Quasi Two-Level Operation of Modular Multilevel Converter for Use in a High-Power DC Transformer With DC Fault Isolation Capability," in IEEE Transactions on Power Electronics, vol. 30, No. 1, pp. 108-123, Jan. 2015, doi: 10.1109/TPEL.2014.2306453.

Prashanth Chennamsetty et al., A Novel Capacitor Voltage Balancing Method in Modular Multilevel Converters, IEEE, 2015.

S. Parashar et al., "High Power Medium Voltage Converters Enabled by High Voltage SiC Power Devices," 2018 International Power Electronics Conference (IPEC-Niigata 2018-ECCE Asia), Niigata, Japan, 2018, pp. 3993-4000, doi: 10.23919/IPEC.2018.8506674.

B. Hu et al., "A gate drive with active voltage divider based auxiliary power supply for medium voltage SiC device in high voltage applications," 2018 IEEE Applied Power Electronics Conference and Exposition (APEC), San Antonio, TX, USA, 2018, pp. 2979-2985, doi: 10.1109/APEC.2018.8341443.

* cited by examiner

… (patent background continues)

HIGH VOLTAGE DEVICE BUILT FROM MODULAR LOW VOLTAGE DEVICES AND OPERATION METHODS THEREOF

RELATED APPLICATION

This application claims the benefit of priority to U.S. Provisional Application No. 63/179,805, filed Apr. 26, 2021, the entire contents of which are incorporated herein by reference for all purposes.

TECHNICAL FIELD

The present disclosure relates to a high voltage device built from multiple modular low voltage devices for medium voltage (MV) applications, and operation methods thereof.

BACKGROUND

Semiconductor devices are the key building block in power conversion systems. In MV applications (e.g., 1 kV to 100 kV), high voltage devices are desired to simplify the conversion system architecture. For example, with 10 kV SiC devices, two level phase leg operation is feasible even with around a 6-8 kV bus voltage. Many high voltage wide band gap literatures have been reported from both the industry and the academia. See, Refs. 1-5. However, many drawbacks exist for the high voltage planar structure wide band gap devices, as summarized below.

First, high voltage devices (e.g., greater than 3.3 kV) are not yet mature and suffer a very low device yield ratio and thus very high cost. Second, because of the structure limitation, a high voltage single device faces 1D barrier limitation. Therefore, the conduction loss is quite significant in comparison with multiple lower voltage devices connected in a cascaded configuration. Third, a high voltage single device also faces the challenges of thermal dissipation barrier. Last but not least, the strong dv/dt for high voltage applications creates very strong harmonics and thus creates challenges for the system level integration or raises output filter and insulation requirements. To overcome the above and other drawbacks, several published literatures focus on the use of lower voltage devices in a cascaded configuration.

FIG. 1 shows a conventional cascaded high voltage device structure that uses both MOSFET and JFET connected in a cascaded configuration. See, Refs. 6-8. To balance the voltage sharing, especially during the fast transient, passive RC network is connected in parallel to slow down the device at different locations to form a uniform dynamic voltage (dv/dt), thereby sharing the dynamic voltage. However, the paralleled capacitors would store more energy to be dissipated into the device channel and create higher switching loss. Meanwhile, the voltage sharing is very sensitive to the passive components value and thus difficult to scale.

FIG. 2 shows another conventional cascaded high voltage device structure similar to that shown in FIG. 1, but uses a capacitor and a Zener diode clamp to balance the dynamic voltage sharing. See, Ref. 9. This solution also suffers from the higher switching loss and sensitivity of the Zener diode characteristic. Both solutions given in FIGS. 1 and 2 use a passive network to do the voltage balancing, and they are difficult to scale up, yet maintaining good voltage sharing.

FIG. 3 shows a conventional dynamic voltage (dv/dt) control for semiconductor devices connected in a cascaded configuration. See, Ref. 10. As shown in FIG. 3, the voltage sharing is achieved through the active dv/dt control function embedded in the gate driver. In this solution, there is no external snubber or balancing circuit, so technically speaking, lower switching loss is possible. The dv/dt control function is implemented in the gate driver. Device dynamic voltage is shared and controls a current injection circuit which is connected to the device gate pins to inject or absorb gate current to slow down or speed up the dv/dt.

FIG. 4 shows another conventional dynamic voltage (dv/dt) control for semiconductor devices connected in a cascaded configuration. See, Refs. 11, 12. As shown in FIG. 4, the voltage sharing is achieved through the active delay time control function embedded in the gate driver. Device drain-source voltage is sensed and compared with a reference value to create a negative feedback to provide a controlled delay time in the gate channel. Both FIGS. 3 and 4 are quite complex and require a highly accurate controller embedded in the gate driver. They are still difficult to scale up for more devices in a cascaded configuration.

FIG. 5 shows a conventional high voltage phase leg configuration using a flying capacitor converter as a basic structure. See, Ref. 13. As shown in FIG. 5, the semiconductor devices in the phase leg configuration in the flying capacitor configuration are controlled in quasi-two level and thus lead to a smaller capacitor volume. To achieve higher power density and reduce the number of passive components, positive or negative devices can be controlled in a quasi-two level operation. Smaller switching node equivalent dv/dt can also be achieved. However, this approach is not a modular solution, because $C_1$ is a low voltage capacitor and $C_2$ and $C_3$ are higher voltage capacitors, which require more low voltage capacitors in series for MV applications. Because this solution is non-modular, it is difficult to minimize the switching loop parasitic. Therefore, the switching loss is higher and it is difficult to scale up for more cells in a cascaded configuration.

FIG. 6 shows a conventional circuit including two integrated capacitor blocked transistor (ICBT) cells, each having two active semiconductor devices (e.g., MOSFETs) and one capacitor. See, Ref. 14. The ICBT cell can be connected in series or in parallel for higher voltage or higher power applications. This solution is modular and therefore can be scaled up. In this solution, however, when the ICBT cells are connected in series, all of the series connected ICBT cells are switched simultaneously and the output dv/dt cannot be controlled.

FIG. 7 shows a typical modular multi-level converter (MMC) structure in high voltage DC (HVDC) applications. See, Ref. 15. To reduce the footprint and reduce the energy storage component size, the MMC legs are controlled in quasi-two level (Q2L) mode, but the switching frequency is still in the range of 100's of Hz and the control and balancing solution is still similar to traditional MMC converters.

REFERENCES

1. S. Sabri et al., "New generation 6.5 kV SiC power MOSFET," 2017 IEEE 5th Workshop on Wide Bandgap Power Devices and Applications (WiPDA), Albuquerque, NM, 2017, pp. 246-250.
2. V. Pala et al., "10 kV and 15 kV silicon carbide power MOSFETs for next-generation energy conversion and transmission systems," 2014 IEEE Energy Conversion Congress and Exposition (ECCE), Pittsburgh, PA, 2014, pp. 449-454.
3. A. Bolotnikov et al., "Overview of 1.2 kV-2.2 kV SiC MOSFETs targeted for industrial power conversion applications," 2015 IEEE Applied Power Electronics Conference and Exposition (APEC), Charlotte, NC, 2015, pp. 2445-2452, doi: 10.1109/APEC.2015.7104691.
4. J. L. Hostetler, P. Alexandrov, X. Li, L. Fursin and A. Bhalla, "6.5 kV SiC normally-off JFETs— Technology status," 2014 IEEE Workshop on Wide Bandgap Power Devices and Applications, Knoxville, TN, 2014, pp. 143-146.
5. A. Bolotnikov, et al. "SiC Charge-Balanced Devices Offering Breakthrough Performance Surpassing the 1-D Ron Versus BV Limit", ECSCRM 2018.
6. K. Vechalapu, S. Bhattacharya and E. Aleoiza, "Performance evaluation of series connected 1700V SiC MOSFET devices," 2015 IEEE 3rd Workshop on Wide Bandgap Power Devices and Applications (WiPDA), Blacksburg, V A, 2015, pp. 184-191.
7. L. Zhang, S. Sen, Z. Guo, X. Zhao, A. Q. Huang and X. Song, "7.2-kV/60-A Austin SuperMOS: An Enabling SiC Switch Technology for Medium Voltage Applications," 2019 IEEE Electric Ship Technologies Symposium (ESTS), Washington, DC, USA, 2019, pp. 523-529, doi: 10.1109/ESTS.2019.8847863.
8. X. Song, A. Q. Huang, S. Sen, L. Zhang, P. Liu and X. Ni, "15-kV/40-A FREEDM Super-cascode: A Cost-Effective SiC High-Voltage and High-Frequency Power Switch," in IEEE Transactions on Industry Applications, vol. 53, no. 6, pp. 5715-5727, November-December 2017.
9. B. Gao, A. J. Morgan, Y. Xu, X. Zhao and D. C. Hopkins, "6.0 kV, 100 A, 175 kHz super cascode power module for medium voltage, high power applications," 2018 IEEE Applied Power Electronics Conference and Exposition (APEC), San Antonio, TX, 2018, pp. 1288-1293.
10. Raszmann, Emma Barbara, "Series-Connection of Silicon Carbide MOSFET Modules using Active Gate-Drivers with dv/dt Control," 2019 Master Thesis.
11. Xiang Lin, "Active Voltage Balancing for Series-Connected 10 kV SiC MOSFETs," WBG-HPCS Review Q3-2019.
12. P. Wang, F. Gao, Y. Jing, Q. Hao, K. Li and H. Zhao, "An Integrated Gate Driver with Active Delay Control Method for Series Connected SiC MOSFETs," 2018 IEEE 19th Workshop on Control and Modeling for Power Electronics (COMPEL), Padua, 2018, pp. 1-6.
13. P. Czyz, P. Papamanolis, T. Guillod, F. Krismer and J. W. Kolar, "New 40 kV/300 kVA Quasi-2-Level Operated 5-Level Flying Capacitor SiC 'Super-Switch' IPM," 2019 10th International Conference on Power Electronics and ECCE Asia (ICPE 2019—ECCE Asia), Busan, Korea (South), 2019, pp. 813-820.
14. "Power Converter Having Integrated Capacitor-Blocked Transistor Cells" US Patent, U.S. Pat. No. 9,525,348 B1, 2016.
15. I. A. Gowaid, G. P. Adam, A. M. Massoud, S. Ahmed, D. Holliday and B. W. Williams, "Quasi Two-Level Operation of Modular Multilevel Converter for Use in a High-Power DC Transformer With DC Fault Isolation Capability," in IEEE Transactions on Power Electronics, vol. 30, no. 1, pp. 108-123, January 2015, doi: 10.1109/TPEL.2014.2306453.

SUMMARY

In the present disclosure, a high voltage device built from modular low voltage cells is provided. For each low voltage cell, it is composed of low voltage semiconductor devices and low voltage passive components. Each cell be a current-bidirectional two-quadrant switch or a four-quadrant switch. In certain embodiments, all the cells may be identical and controlled with a delay time in between. Therefore, the total on and off time of the high voltage device can be controlled to reduce the output equivalent dv/dt. The cell's voltage balancing can be achieved through a control algorithm disclosed herein. Because of the modular solution, the switching loop impedance for each cell can be well maintained and thus the switching loss of the disclosed solution can be quite low even in hard switching applications. The present disclosure provides a building block solution that can be extended to other applications, such as, two level hard switching converter, two level soft switching converter, multilevel converter, etc.

In one aspect, the present disclosure provides a high voltage device comprising: a plurality of modular cells, each comprising a first terminal, a second terminal, and a control terminal; wherein the modular cells are connected in series, such that the first terminal of one of the modular cells is connected to the second terminal of a neighboring one of the modular cells; and wherein each of the modular cells comprises a plurality of low voltage semiconductor devices and one or more low voltage passive components.

In one embodiment, said one or more low voltage passive components comprises a capacitor.

In one embodiment, said plurality of low voltage semiconductor devices comprises at least two power MOSFETs.

In one embodiment, each of the modular cells is a current-bidirectional two-quadrant switch.

In one embodiment, the current-bidirectional two-quadrant switch comprises a main active switch, an auxiliary active switch, and a capacitor connected to form a circuit loop, wherein a first point between the main active switch and the auxiliary active switch is connected to the first terminal and a second point between the main active switch and the capacitor is connected to the second terminal.

In one embodiment, the current-bidirectional two-quadrant switch comprises a first circuit loop connected to the first terminal and a second circuit loop connected to the second terminal, wherein the first circuit loop includes a first main active switch, a first auxiliary switch, and a first capacitor connected in series, and the second circuit loop includes a second main active switch, a second auxiliary switch, and a second capacitor connected in series, and wherein a first point of the first circuit loop between the first main active switch and the first capacitor is connected to a second point of the second circuit loop between the second auxiliary switch and the second capacitor.

In one embodiment, each of the modular cells is a four-quadrant switch.

In one embodiment, the four-quadrant switch comprises first, second, and third circuit legs connected in parallel between the first and second terminals, the first circuit leg comprising a first auxiliary switch and a first capacitor connected in series, the second circuit leg comprising a first main switch and a second main switch connected in series, and the third circuit leg comprising a second auxiliary switch and a second capacitor connected in series.

In one embodiment, sources of the first and second main switches are connected with each other.

In one embodiment, the four-quadrant switch comprises a first circuit loop connected to the first terminal and a second circuit loop connected to the second terminal, wherein the first circuit loop includes a first main active switch, a first auxiliary switch, and a first capacitor connected in series, and the second circuit loop includes a second main active switch, a second auxiliary switch, and a second capacitor connected in series, and wherein a first point of the first circuit loop between the first main active switch and the first capacitor is connected to a second point of the second circuit loop between the second main active switch and the second capacitor.

In one embodiment, the control terminal of the modular cells is configured to receive a control signal shifted by a delay time for a respective one of the modular cells.

In another aspect, the present disclosure provides a high voltage half bridge device, comprising: first, second, and third terminals; a top arm connected between the first terminal and the second terminal, the top arm comprising a first quantity of low voltage modular cells connected in a cascaded form; and a bottom arm connected between the first terminal and the third terminal, the top arm comprising a second quantity of low voltage modular cells connected in a cascaded form; wherein the second quantity is equal to the first quantity.

In one embodiment, each of first and second quantities of the modular cells is a current-bidirectional two-quadrant switch.

In one embodiment, the high voltage half bridge device further comprises a control terminal configured to receive a control signal for each of the low voltage modular cells, the control signal being shifted by a delay time for a respective one of the low voltage modular cells.

In still another aspect, the present disclosure provides a method for controlling the high voltage device described above, the method comprising: transmitting a control signal to the control terminal of each of the modular cells, the control signal being shifted by a delay time for a respective one of the modular cells; and sensing cell voltages of the modular cells; and balancing the cell voltages.

In one embodiment, balancing the cell voltages comprises, for each of the modular cells: determining a voltage difference by comparing a respective one of the cell voltages with a reference voltage; determining a duty cycle difference based on the voltage difference; and modifying a duty cycle of the control signal for a respective one of the modular cells by the duty cycle difference.

In one embodiment, the method further comprises sensing an output current polarity of the high voltage device, wherein modifying the duty cycle comprises: subtracting the duty cycle difference from the duty cycle, if said respective one of the cell voltages is greater than the reference voltage and the output current polarity is greater than zero, and if said respective one of the cell voltage is not greater than the reference voltage and the output current polarity is not greater than zero; and adding the duty cycle different to the duty cycle, if said respective one of the cell voltage is greater than the reference voltage and the output current polarity is not greater than zero, and if said respective one of the cell voltages is not greater than the reference voltage and the output current polarity is greater than zero.

In one embodiment, balancing the cell voltages comprises: sensing an output current polarity of the high voltage device; sorting the cell voltages of the modular cells from large to small in sequence; wherein, if the output current polarity is greater than zero, one of the modular cells having a larger cell voltage than another one of the modular cells is sequenced to a leading position; and wherein, if the output current polarity is not greater than zero, one of the modular cells having a larger cell voltage than another one of the modular cells is sequenced to a lagging position.

DETAILED DESCRIPTION

Figure 8:
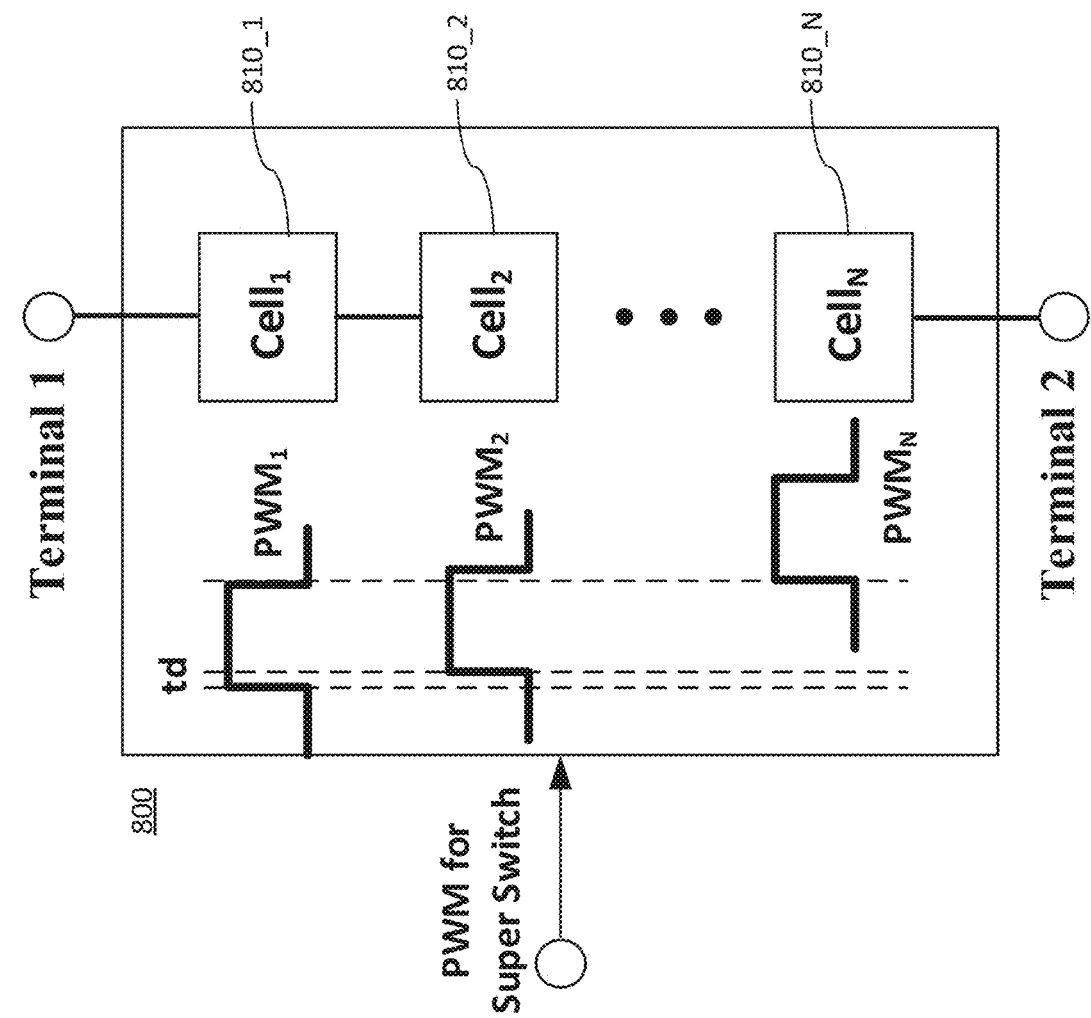
FIG. 8 illustrates a high voltage device having a super switch configuration with a plurality of cells connected in series, in accordance with an embodiment of the present disclosure.

The present disclosure provides a high voltage device that can be built from modular low voltage cells. FIG. 8 illustrates a high voltage device 800 having a super switch configuration, in accordance with an embodiment of the present disclosure. As used herein, a "super switch" is a high voltage switch made up from many low voltage switches in series configuration. As shown in FIG. 8, device 800 includes a plurality of modular cells 810_1, 810_2, ..., 810_N connected in series. Each of modular cells 810_1, 810_2, ..., 810_N comprises a first terminal, a second terminal, and a control terminal, such that the first terminal of one of modular cells 810_1, 810_2, ..., 810_N is connected to the second terminal of a neighboring one of modular cells 810_1, 810_2, ..., 810_N. Each of cells 810_1, 810_2, ... 810_N can constitute a current-bidirectional two-quadrant switch or a four-quadrant switch. The cell structure can also have a two level output or a multilevel output. Terminal 1 and terminal 2 are considered as the two output terminals for the super switch configuration. This is a modular solution and each of cells 810_1, 810_2, ... 810_N is identical. In one example, each of cells 810_1, 810_2, ... 810_N comprises a plurality of low voltage semiconductor devices and one or more low voltage passive components, and controllable by sending a control signal (e.g., a PWM signal) to a control terminal of cells 810_1, 810_2, ... 810_N (e.g., the gate of the low voltage semiconductor devices). Cells 810_1, 810_2, ... 810_N can also have a two level or multilevel structure, as shown from FIGS. 9 through 12. In one embodiment, a low voltage semiconductor device is a power MOSFET and a low voltage passive component is a capacitor, both being operable in the range of about 50V to 600V or about 500V to 1200V.

Figures 1, 2:
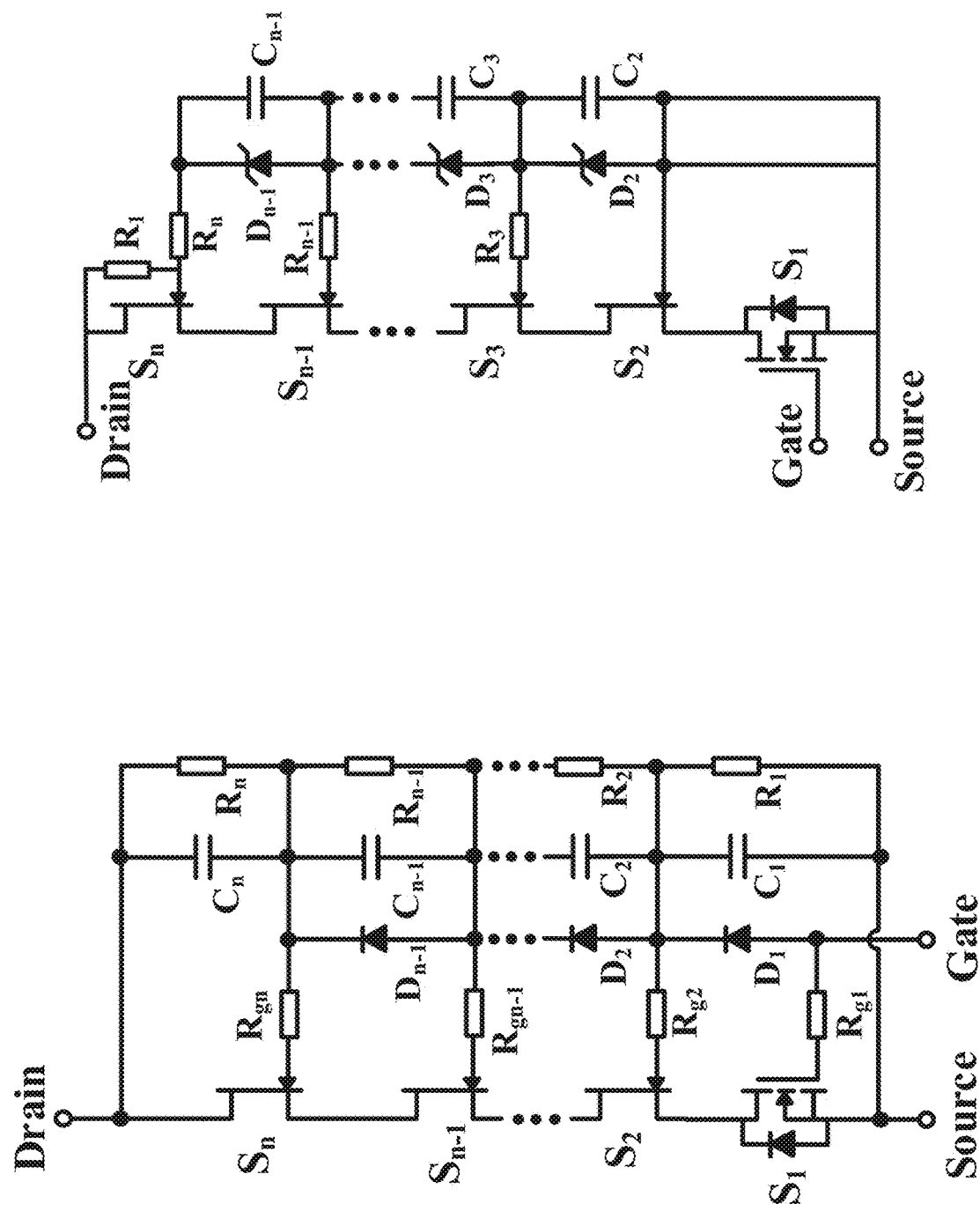
FIG. 1 shows a conventional cascaded high voltage device structure.
FIG. 2 shows another conventional cascaded high voltage device structure.
Figure 4:
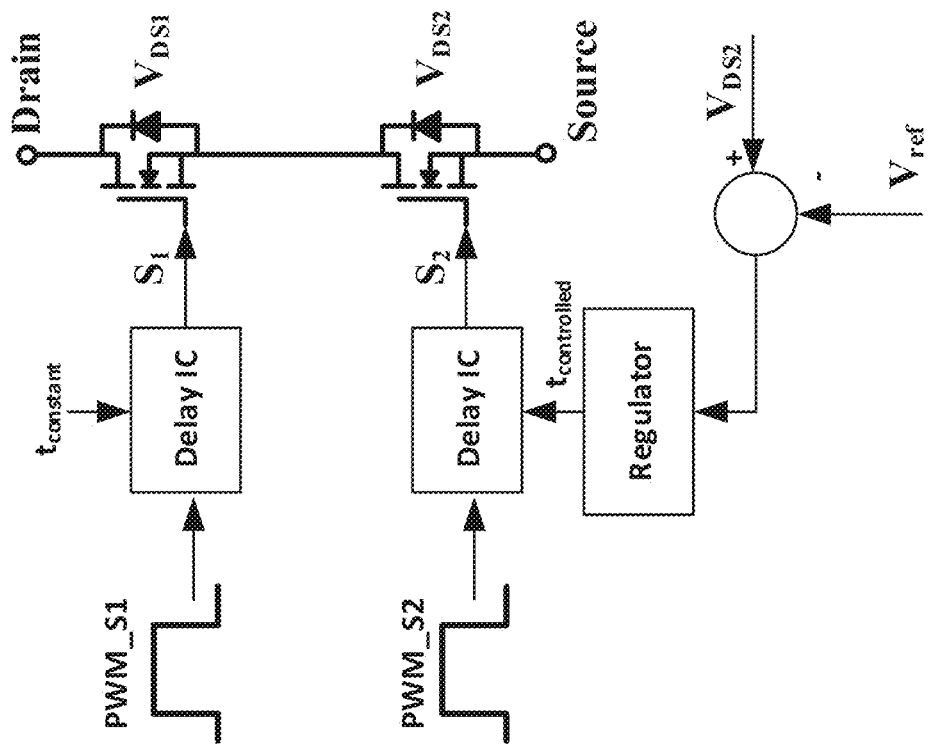
FIG. 4 shows another conventional dynamic voltage (dv/dt) control for semiconductor devices connected in a cascaded configuration.
Figure 3:
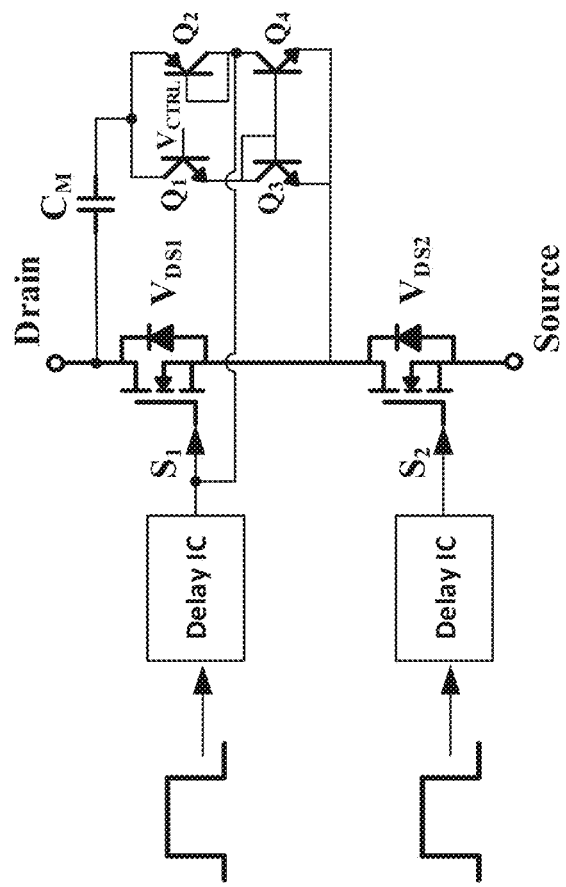
FIG. 3 shows a conventional dynamic voltage (dv/dt) control for semiconductor devices connected in a cascaded configuration.
Figure 5:
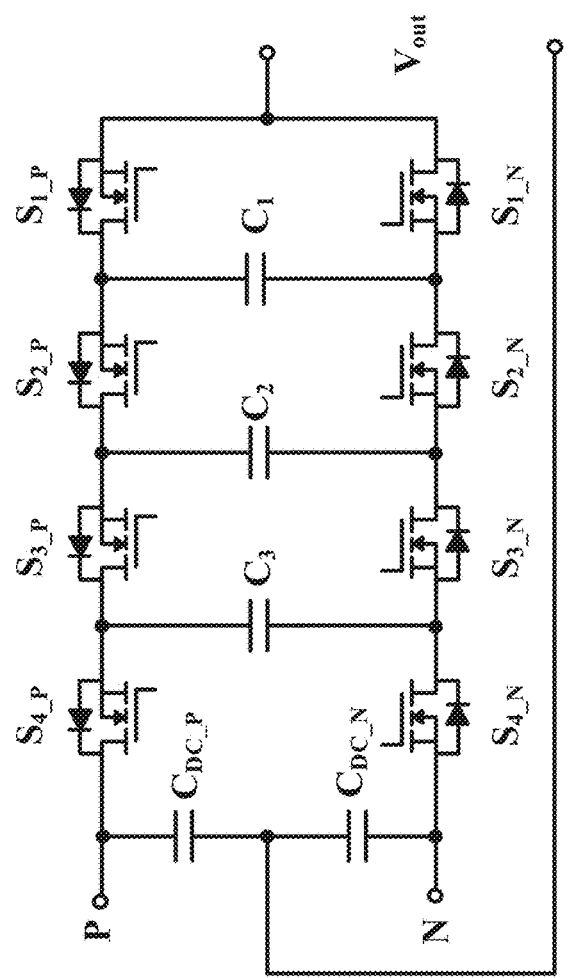
FIG. 5 shows a conventional high voltage phase leg configuration using a flying capacitor converter as a basic structure.
Figure 6:
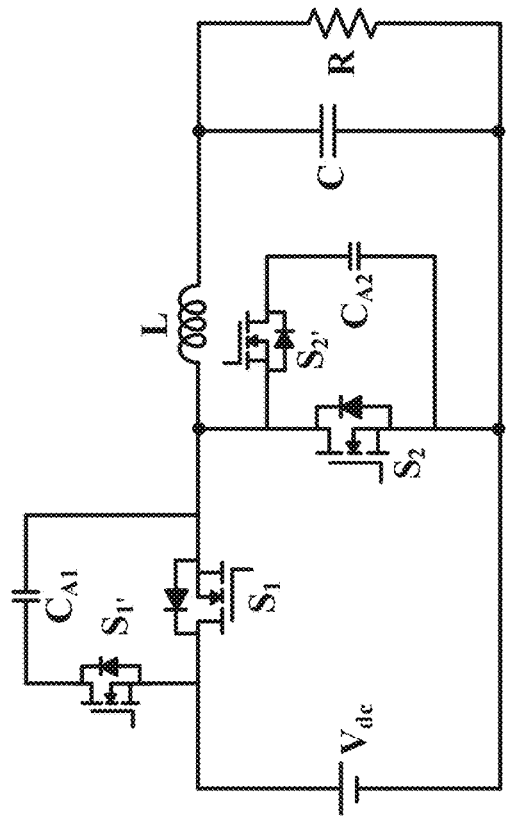
FIG. 6 shows a conventional circuit including two integrated capacitor blocked transistor (ICBT) cells, each having two active semiconductor devices (e.g., MOSFETs) and one capacitor.
Figure 7:
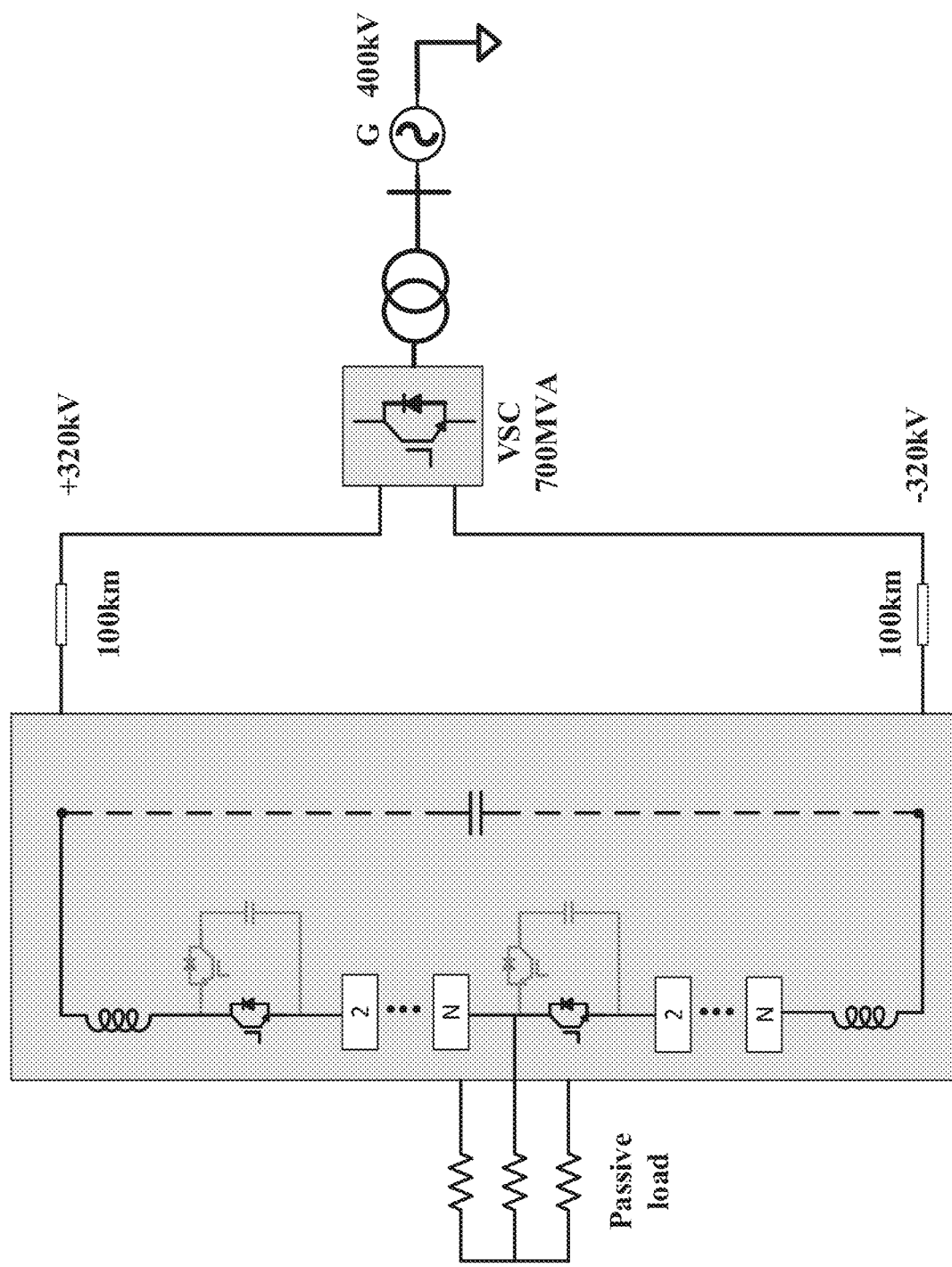
FIG. 7 shows a typical modular multi-level converter (MMC) structure in high voltage DC (HVDC) applications.
Figure 9:
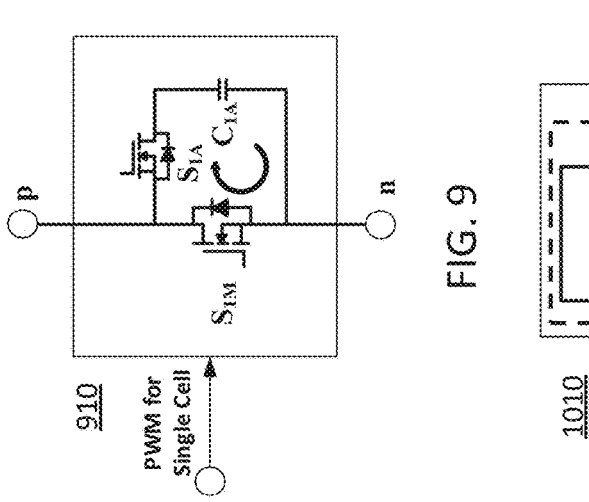
FIG. 9 illustrates an example cell of FIG. 8, having a half bridge two level two quadrant cell structure.

FIG. 9 illustrates an example cell 910 of cells 810_1, 810_2, ... 810_N in FIG. 8, having a half bridge two level two quadrant cell structure. As shown in FIG. 9, cell 910 includes a terminal p between a main active switch Sim and an auxiliary active switch $S_{1A}$ and a terminal n between main active switch Sim and a capacitor $C_{1A}$. Main active switch Sim, auxiliary active switch $S_{1A}$, and capacitor $C_{1A}$ of cell 910 are connected to form a circuit loop. In this embodiment, the drain of switch Sim and the source of switch $S_{1A}$ are connected at an upper point leading to terminal p, while the source of switch Sim and capacitor $C_{1A}$ are at a lower point leading to terminal n. Cell 910 can be controlled by sending control signals (e.g., PWM signals) to the gates of switch Sim and switch $S_{1A}$. For MV applications, a plurality of cells 910 composed of low voltage semiconductor devices can be connected in series by connecting terminal p of one cell with terminal n of a neighboring cell.

Figure 10:
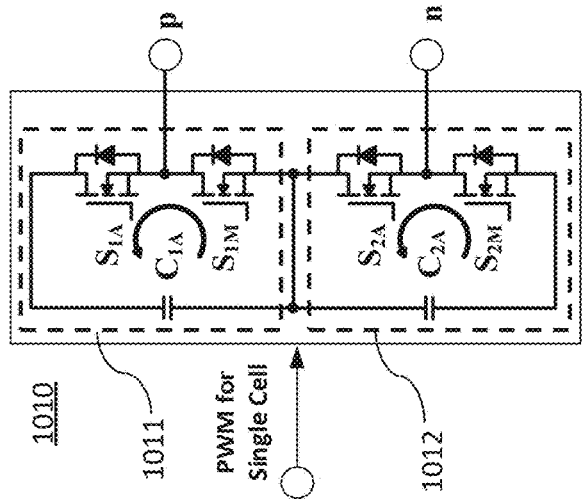
FIG. 10 illustrates another example cell of FIG. 8, having a cascaded half bridge three level two quadrant cell structure.

FIG. 10 illustrates another example cell 1010 of cells 810_1, 810_2, ... 810_N in FIG. 8, having a cascaded half bridge three level two quadrant cell structure. As shown in FIG. 10, cell 1010 includes a terminal p connected to a first circuit loop 1011 and a terminal n connected to a second circuit loop 1012. First circuit loop 1011 includes first main switch Sim, first auxiliary switch $S_{1A}$, and first capacitor $C_{1A}$ connected in series. Second circuit loop 1012 includes second main switch $S_{2M}$, second auxiliary switch $S_{2A}$, and second capacitor $C_{2A}$ connected in series. A point of first circuit loop 1011 (between first main switch Sim and first capacitor $C_{1A}$) is connected to a point of second circuit loop 1012 (between second main switch $S_{2M}$ and second capacitor $C_{2A}$). Cell 1010 can be controlled by sending control signals (e.g., PWM signals) to the gates of switches $S_{1M}$, $S_{1A}$, $S_{2M}$, and $S_{1A}$. For MV applications, a plurality of cells 1010 composed of low voltage semiconductor switches can be connected in series by connecting terminal p of one cell with terminal n of a neighboring cell.

Figure 11:
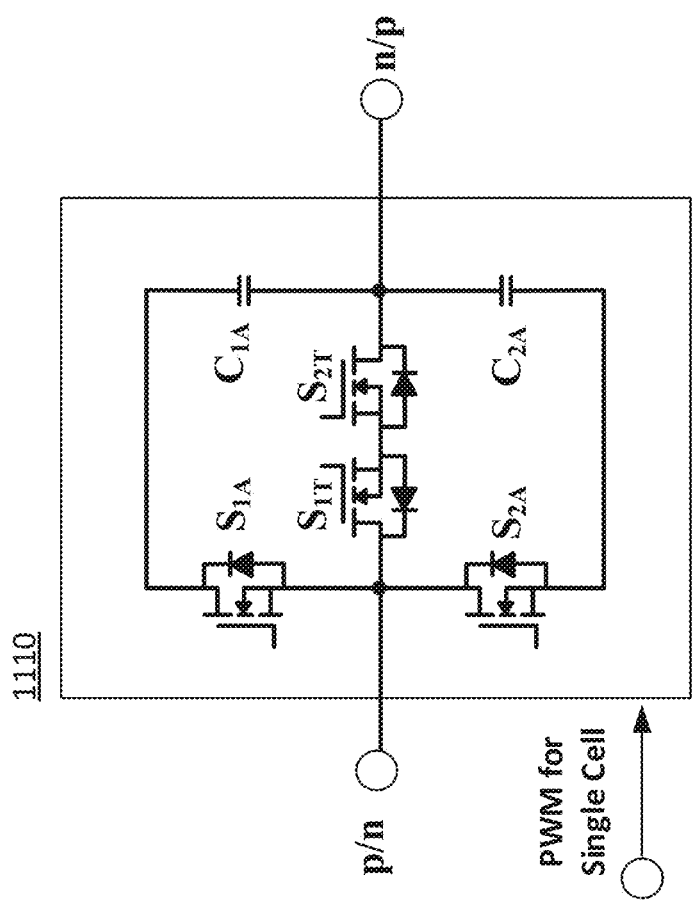
FIG. 11 illustrates still another example cell of FIG. 8, having a T-type four quadrant cell structure.

FIG. 11 illustrates still another example cell 1110 of cells 810_1, 810_2, ... 810_N in FIG. 8, having a T-type four quadrant cell structure. As shown in FIG. 11, cell 1110 includes a terminal p/n and a terminal n/p. Three (top, central, and bottom) circuit legs are connected in parallel between terminals p/n and n/p. Top circuit leg includes, from terminal p/n to terminal n/p, a first auxiliary switch $S_{1A}$ and a first capacitor $C_{1A}$ connected in series. Bottom circuit leg includes, from terminal p/n to terminal n/p, a second auxiliary switch $S_{2A}$ and a second capacitor $C_{2A}$ connected in series. Central circuit leg includes, from terminal p/n to terminal n/p, a first main switch $S_{1T}$ and a second main switch $S_{2T}$ connected in series. In this embodiment, sources of switches $S_{1T}$ and $S_{2T}$ are connected with each other. Cell 1110 can be controlled by sending control signals (e.g., PWM signals) to the gates of switches $S_{1A}$, $S_{1T}$, $S_{2A}$, and $S_{1T}$. For MV applications, a plurality of cells 1110 composed of low voltage semiconductor switches can be connected in series by connecting terminal p/n of one cell with terminal n/p of a neighboring cell.

Figure 12:
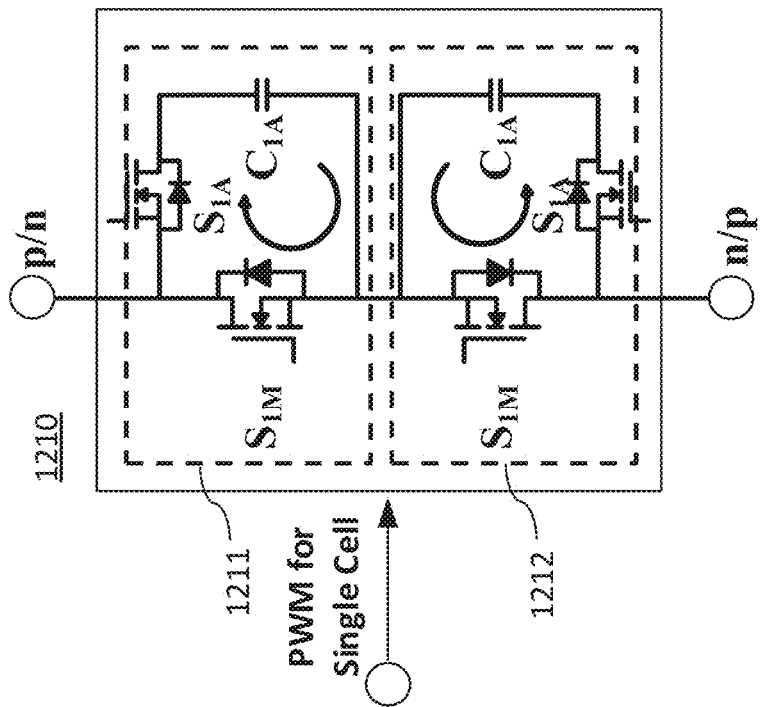
FIG. 12 illustrates yet another example cell of FIG. 8, having a four quadrant cell structure.

FIG. 12 illustrates yet another example cell 1210 of cells 810_1, 810_2, ... 810_N in FIG. 8, having a four quadrant cell structure. As shown in FIG. 12, cell 1210 includes a terminal p/n connected to a first circuit loop 1211 and a terminal n/p connected to a second circuit loop 1212. Cell 1210 of FIG. 12 is substantially the same as cell 1010 of FIG. 10, except that second circuit loop 1212 in FIG. 12 is flipped or upside down as second circuit loop 1012 of FIG. 10 so as to achieve a four quadrant device. That is, a point of first circuit loop 1211 (between first main switch Sim and first capacitor $C_{1A}$) is connected to a point of second circuit loop 1212 (between second main switch $S_{2M}$ and second capacitor $C_{2A}$). Cell 1210 can be controlled by sending control signals (e.g., PWM signals) to the gates of switches $S_{1M}$, $S_{1A}$, $S_{2M}$, and $S_{1A}$. For MV applications, a plurality of cells 1210 composed of low voltage semiconductor switches can be connected in series by connecting terminal p/n of one cell with terminal n/p of a neighboring cell.

Figure 13:
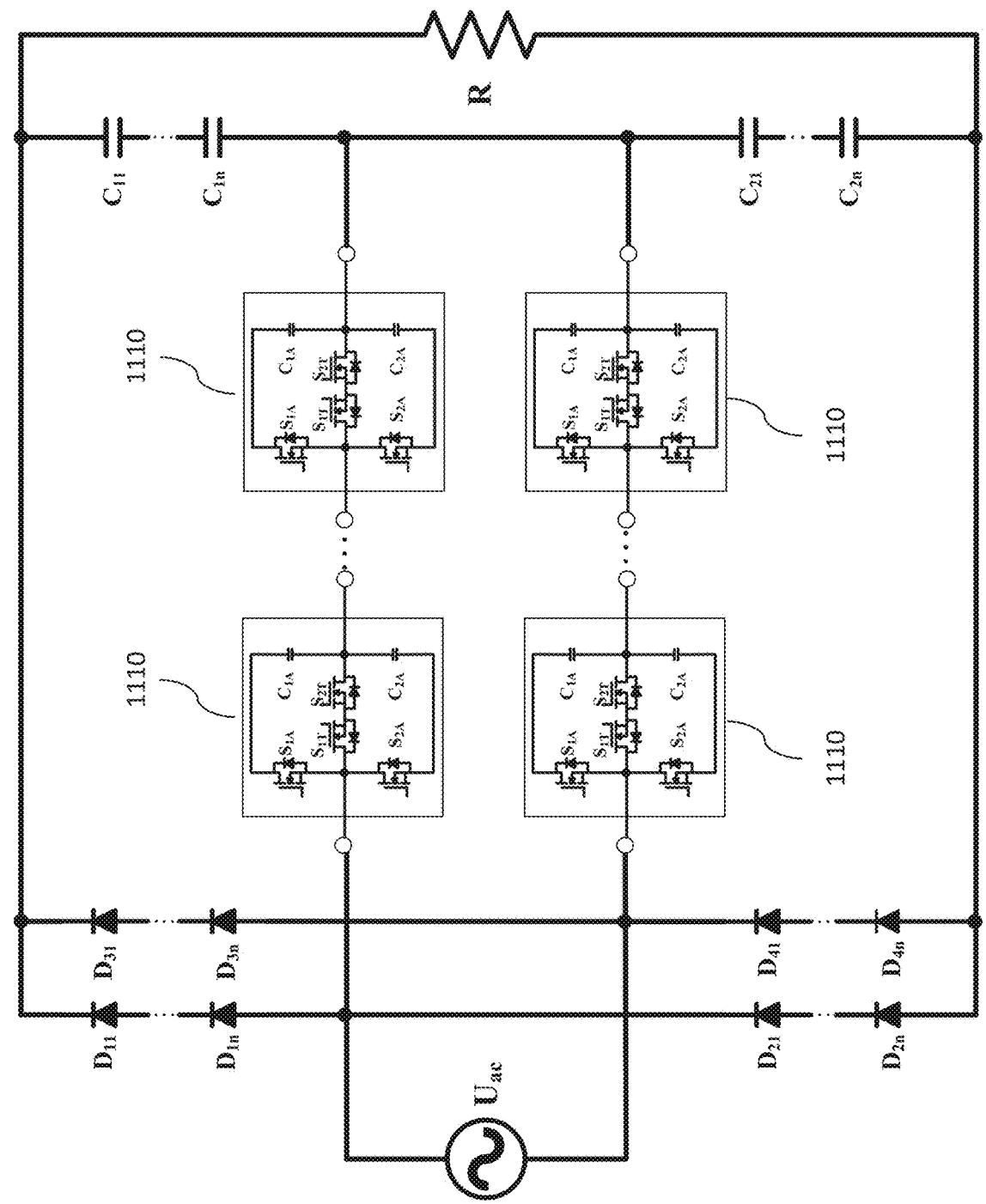
FIG. 13 illustrates an application of the T-type four quadrant cell structure of FIG. 11 in a Vienna rectifier.

FIG. 13 illustrates an application of the T-type four quadrant cell structure of FIG. 11 in a Vienna rectifier, a unidirectional single-phase three-switch three-level Pulse-width modulation (PWM) rectifier, which can be seen as a single-phase diode bridge with an integrated boost converter. As shown in FIG. 13, a plurality of cells 1110 of FIG. 11 are connected in a cascaded configuration for use in a higher voltage application.

Figure 14:
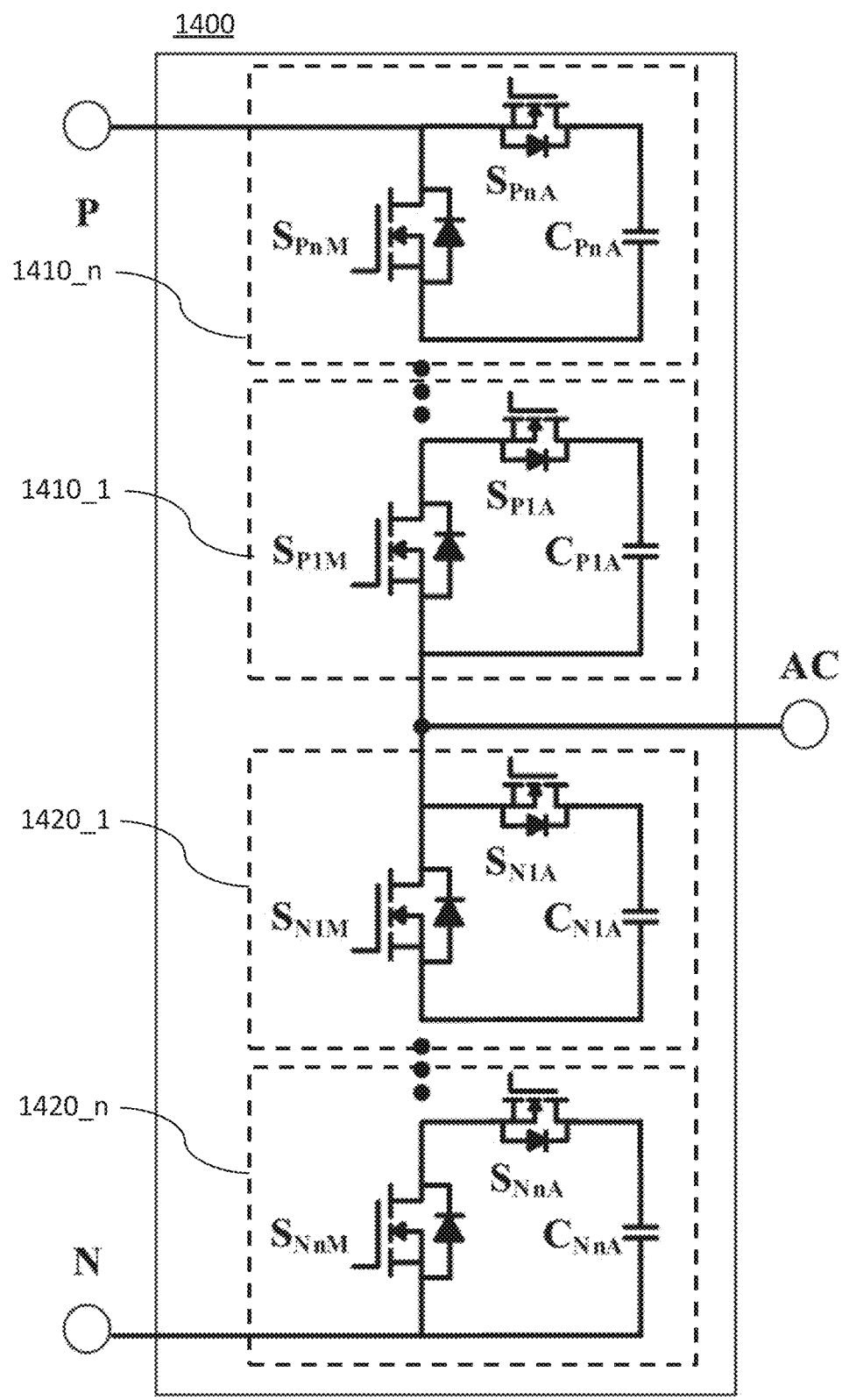
FIG. 14 illustrates an application of using cells of FIG. 9 having a half bridge two quadrant cell structure in a typical phase leg configuration

FIG. 14 illustrates an application of using cells 910 of FIG. 9 having a half bridge two quadrant cell structure in a typical phase leg configuration. As shown in FIG. 14, a half bridge 1400 includes a top super switch or a top arm (from a terminal SW to a terminal P) having a plurality of cascaded cells 1410_1 ... 1410_n connected in series, and a bottom super switch or a bottom arm (from a terminal SW to a terminal N) having a plurality of cascaded cells 1420_1 ... 1420_n connected in series. In this embodiment, each of cells 1410_1 ... 1410_n and 1420_1 ... 1420_n is the same as cell 900 of FIG. 9. In the present disclosure, all the cells are identical, but are controlled with a delay time in between. Therefore the total on and off time of the high voltage device can be controlled to reduce the output equivalent dv/dt. This controlled dv/dt can provide benefits of shaping the output harmonics especially in the medium frequency range which could reduce the need or the footprint for the output filter.

Half bridge 1400 can be controlled in a quasi-two level (Q2L) mode. In one embodiment, four cells are connected in the top arm from terminal SW to terminal P and four cells connected in the bottom arm from terminal SW to terminal N. Each of top and bottom arms can be controlled using complimentary signals. For example, switch $S_{P1M}$ in the upper arm is turned on while switch $S_{N1M}$ in the bottom arm is turn off. Likewise, for each cell, $S_{PnM}$ and $S_{PnA}$ are controlled using complimentary signals, namely, switch $S_{PnM}$ is turned on while switch $S_{PnA}$ is turned off.

Figure 15A:
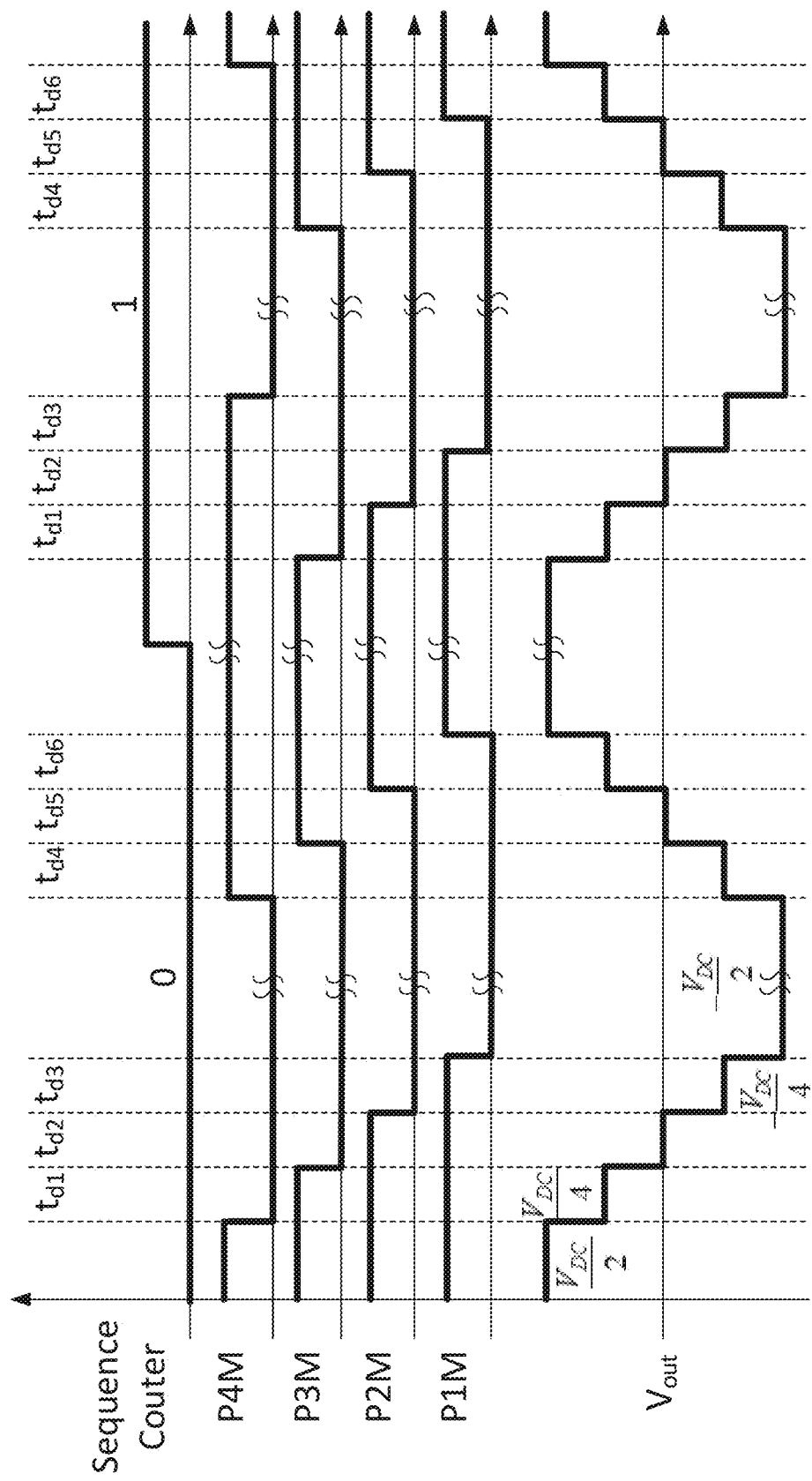
FIGS. 15A and 15B illustrate an exemplary modulation strategy for the phase leg configuration as shown in FIG. 14.
Figure 15B:
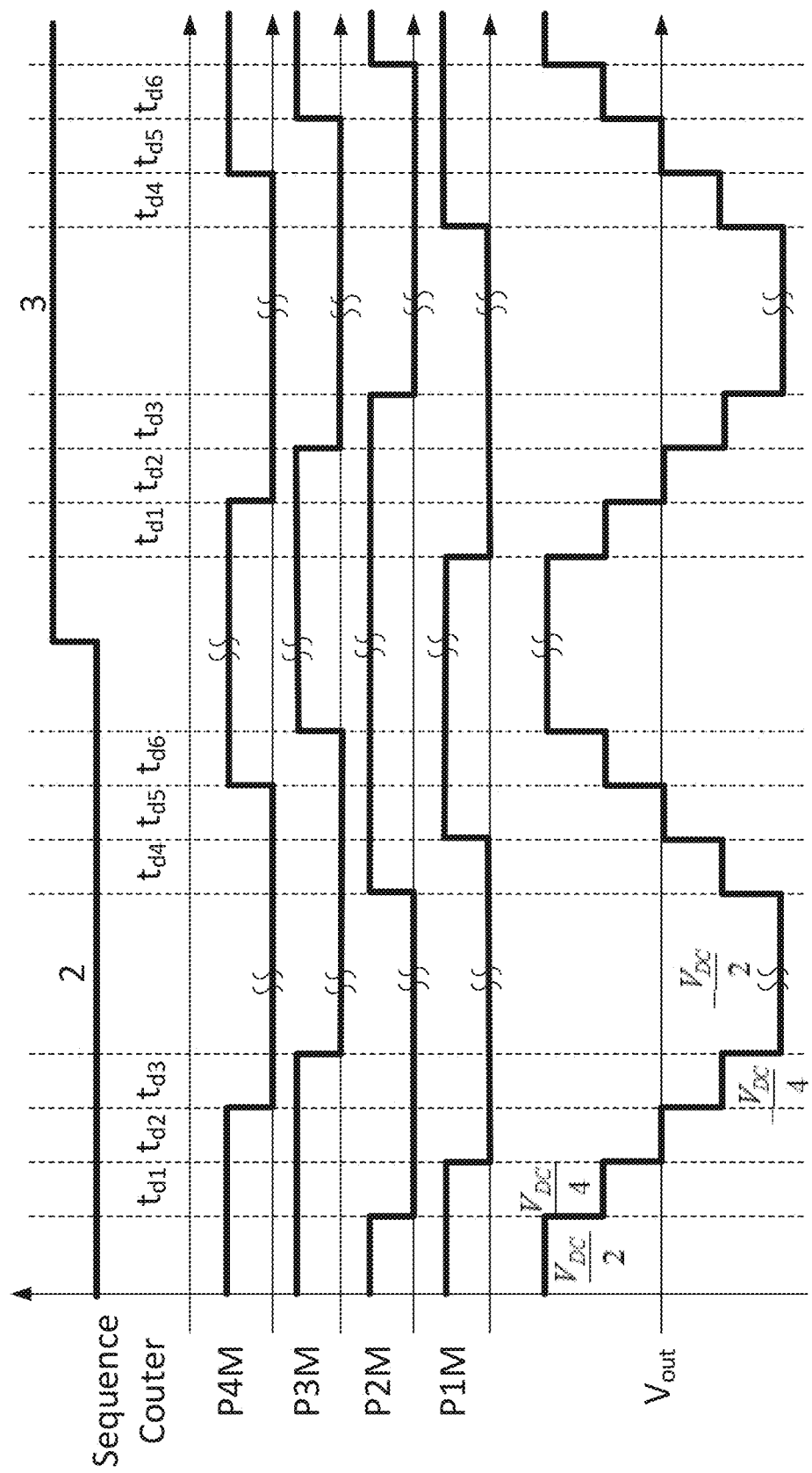
Figure 16:
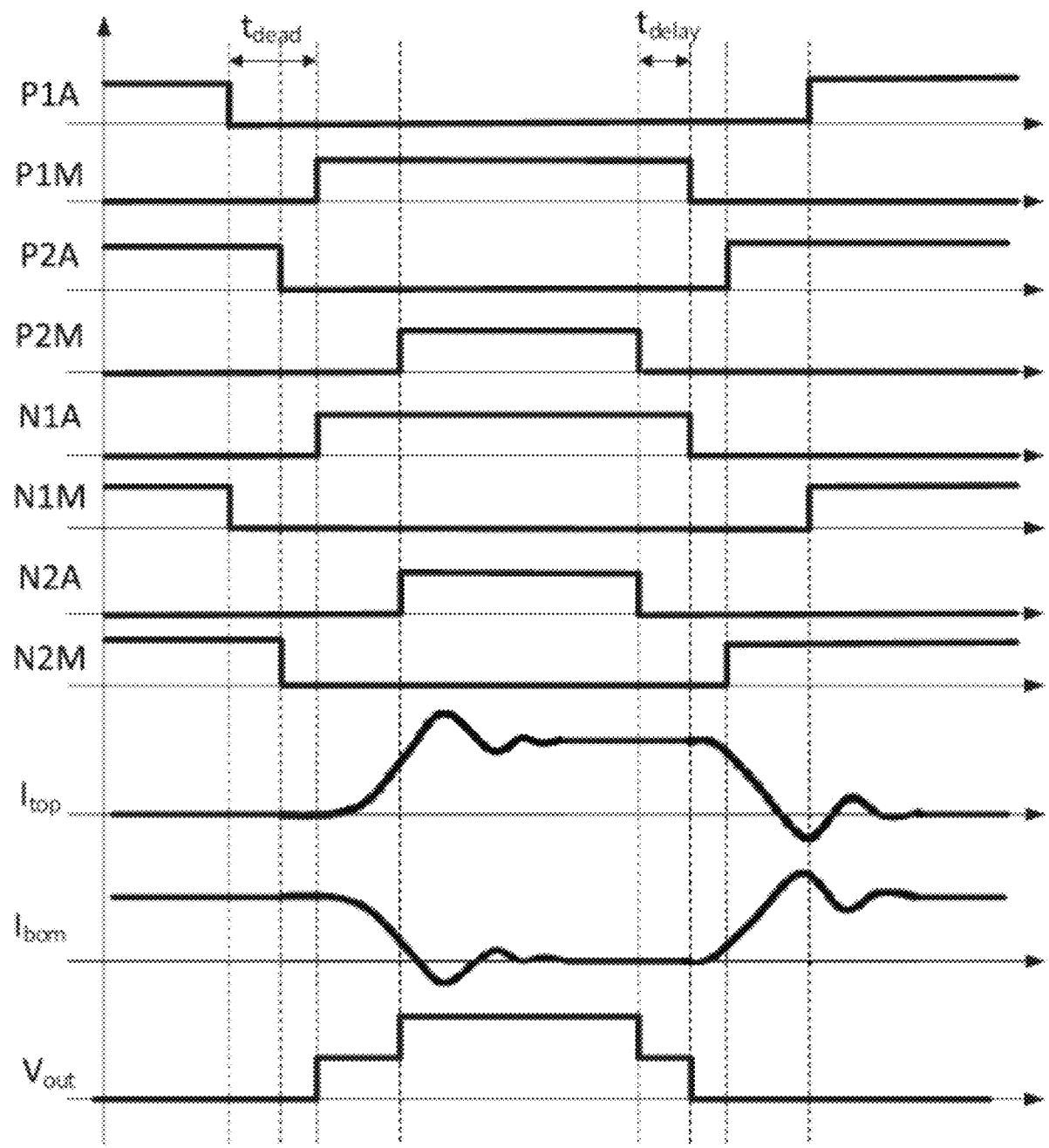
FIG. 16 illustrates exemplary waveforms and gate signals for phase leg configuration as shown in FIG. 14.

FIGS. 15A and 15B illustrate an exemplary modulation strategy for the phase leg configuration as shown in FIG. 14. In this embodiment, a total of four cells are connected in cascaded form for the top arm and another four cells are connected in cascaded form for the bottom arm. FIG. 16 illustrates exemplary waveforms and gate signals for phase leg configuration as shown in FIG. 14. For simplicity, FIG. 16 only shows the waveforms of two cells that are connected in cascaded form for the top arm and two cells that are connected in cascaded form for the bottom arm.

In order to achieve the delay time for each cell, delay time to needs to be inserted between the gating of each cell, as shown in FIG. 15. For simplicity of illustration, only the waveforms P1M, P2M, P3M, and P4M for the top arm switches $S_{PnM}$ are shown. With predefined delay time, some of the cells are switched on or off in the leading position, and some of the cells are switched on or off in the lagging position. The switching node Vsw shows quasi-two level waveforms.

With a certain load current polarity, the leading or lagging position on the control results in unbalanced charging or discharging for energy storage in each cell, which may create a voltage imbalance across all of the series-connected super switch cells. To solve the imbalance with Q2L operation, a rotating sequence was implemented. As shown in FIG. 15, sequence counter is counting from 0 to 3 for every switching period and thus, the leading and lagging position of the each cell physically changes through the cascaded cells. This will ensure the symmetrical charge or discharge for each cell. Each cell voltage needs to be sensed and compared with a voltage reference, which is typically the same for all cell voltages to ensure modularity. The voltage difference is fed into a voltage compensator, which tunes the duty cycle of each cell.

Figures 17, 19:
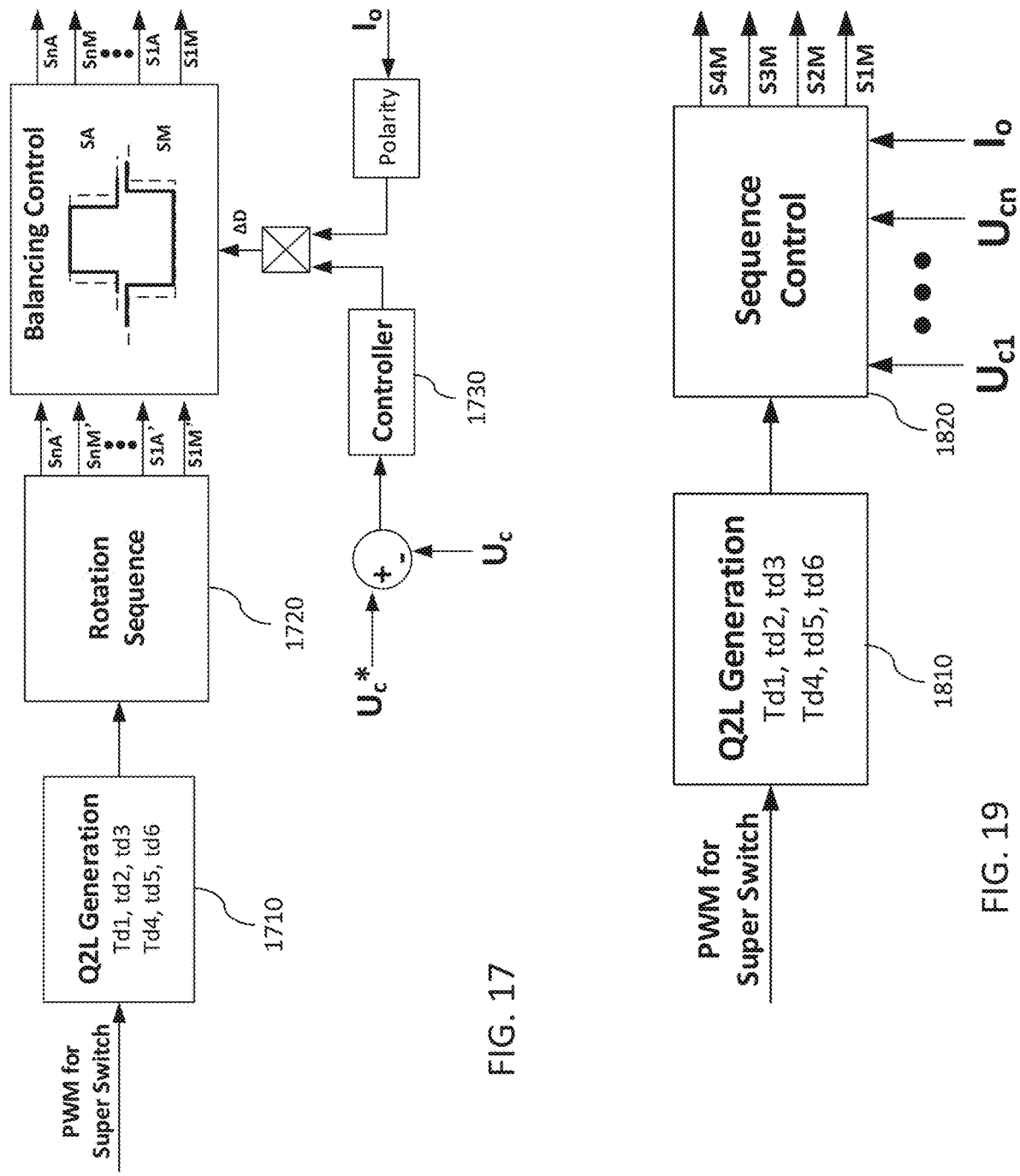
FIG. 17 illustrates a control algorithm in accordance with an embodiment of the present disclosure.
FIG. 19 illustrates a control algorithm in accordance with another embodiment of the present disclosure.
Figure 18:
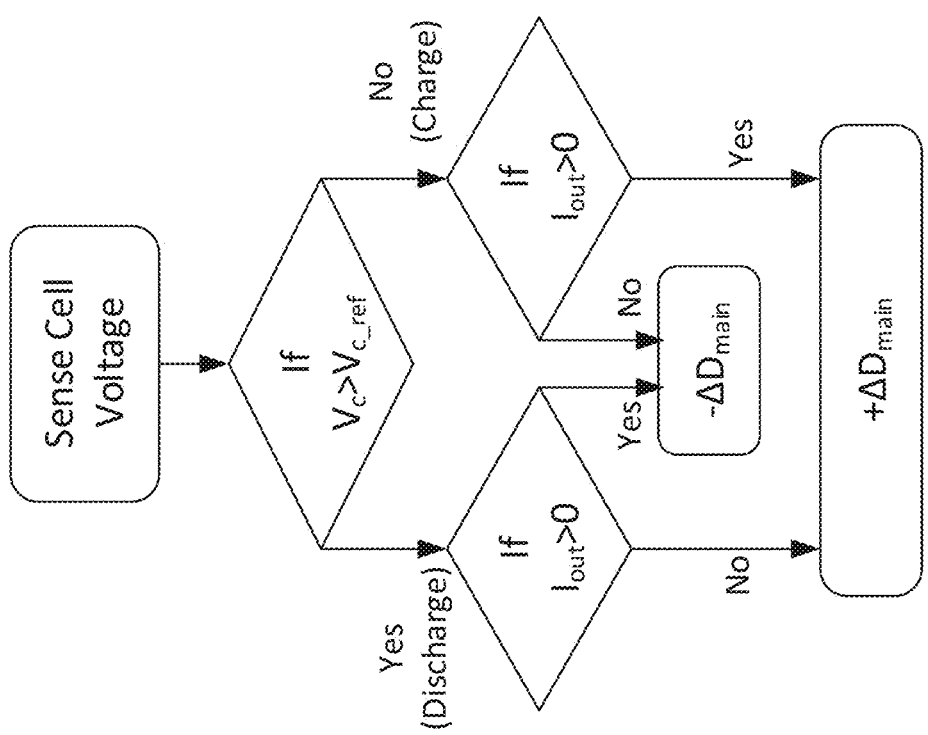
FIG. 18 illustrates a balancing scheme for the control algorithm shown in FIG. 17.
Figure 21:
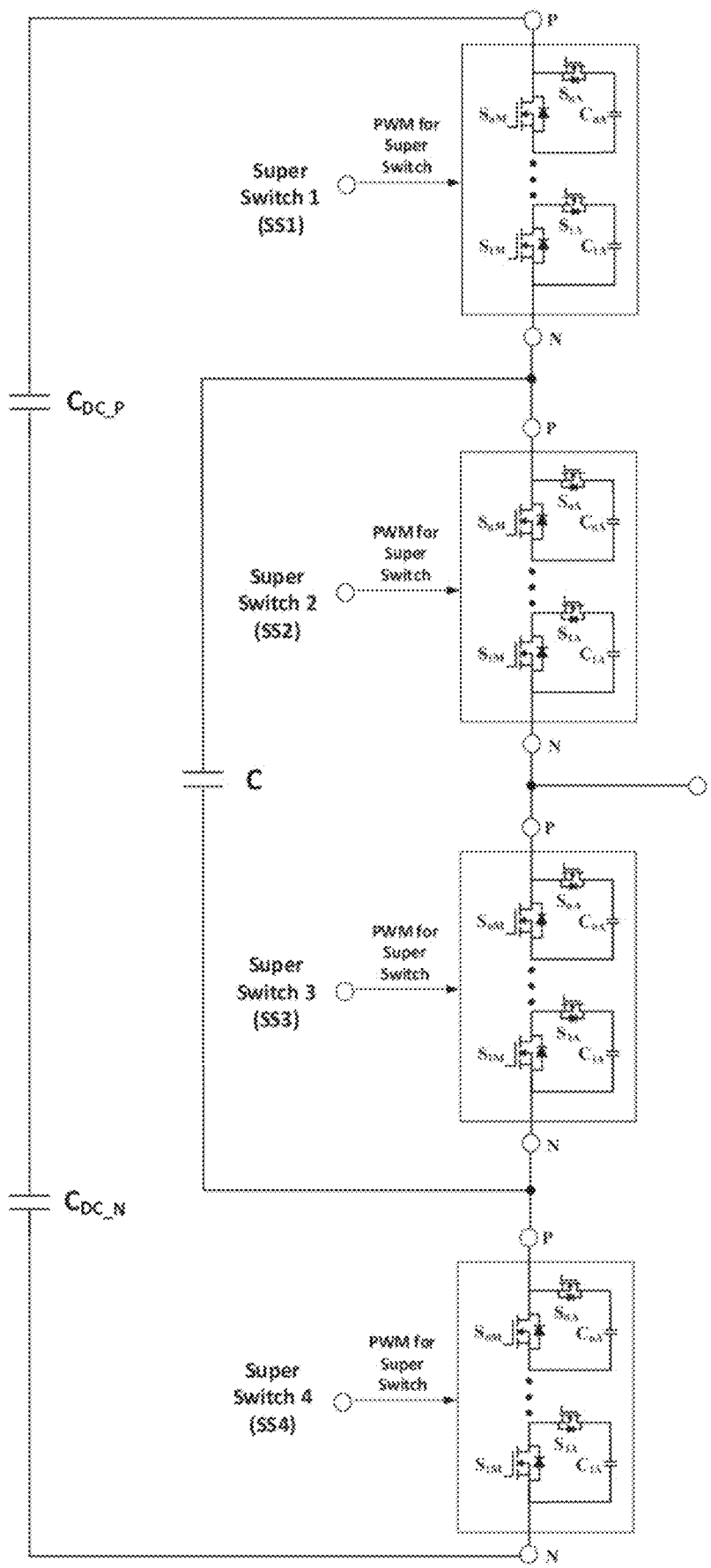
FIG. 21 illustrates a 3-level flying capacitor converter using two-quadrant super switches in accordance with an embodiment of the present disclosure.
Figure 22:
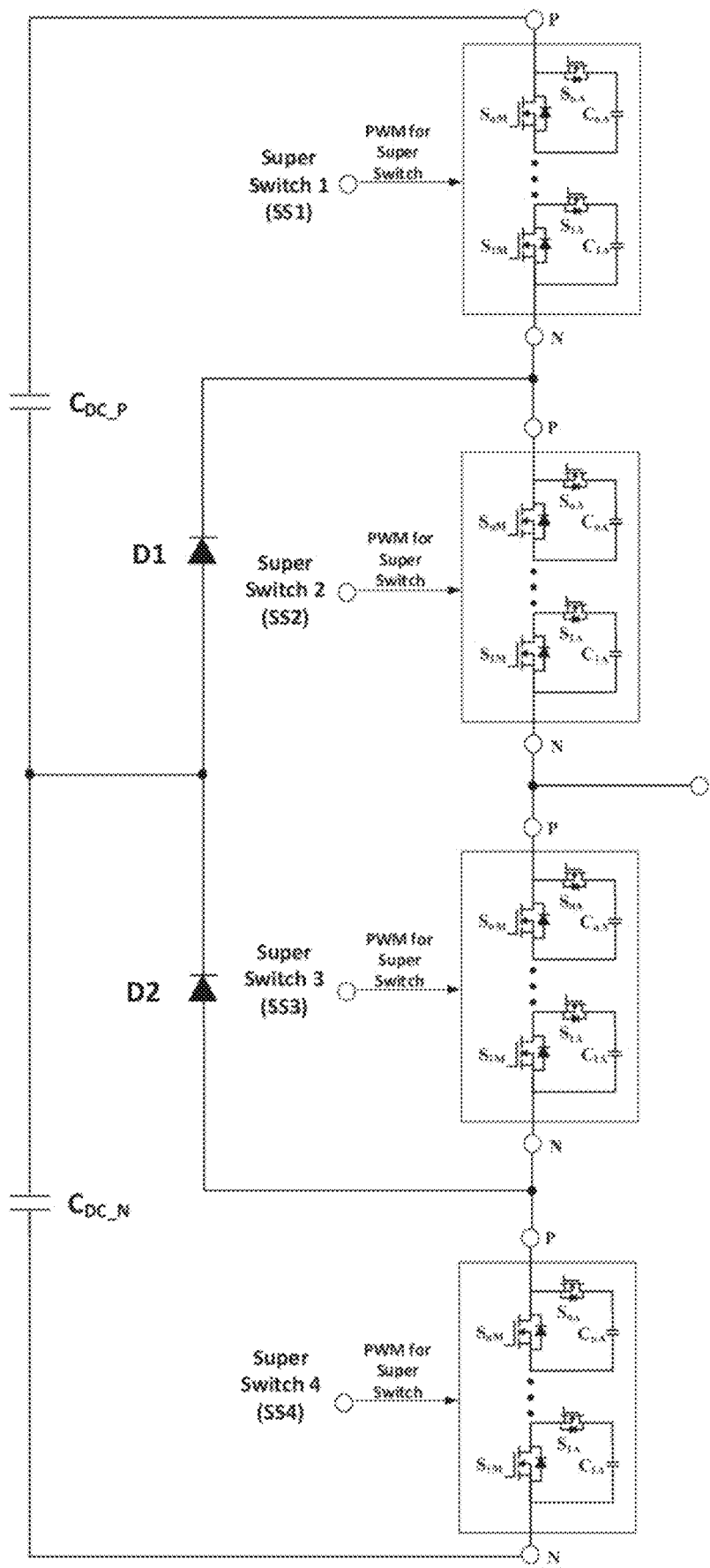
FIG. 22 illustrates a 3-level diode neutral point clamp converter using two-quadrant super switches in accordance with an embodiment of the present disclosure.
Figure 23:
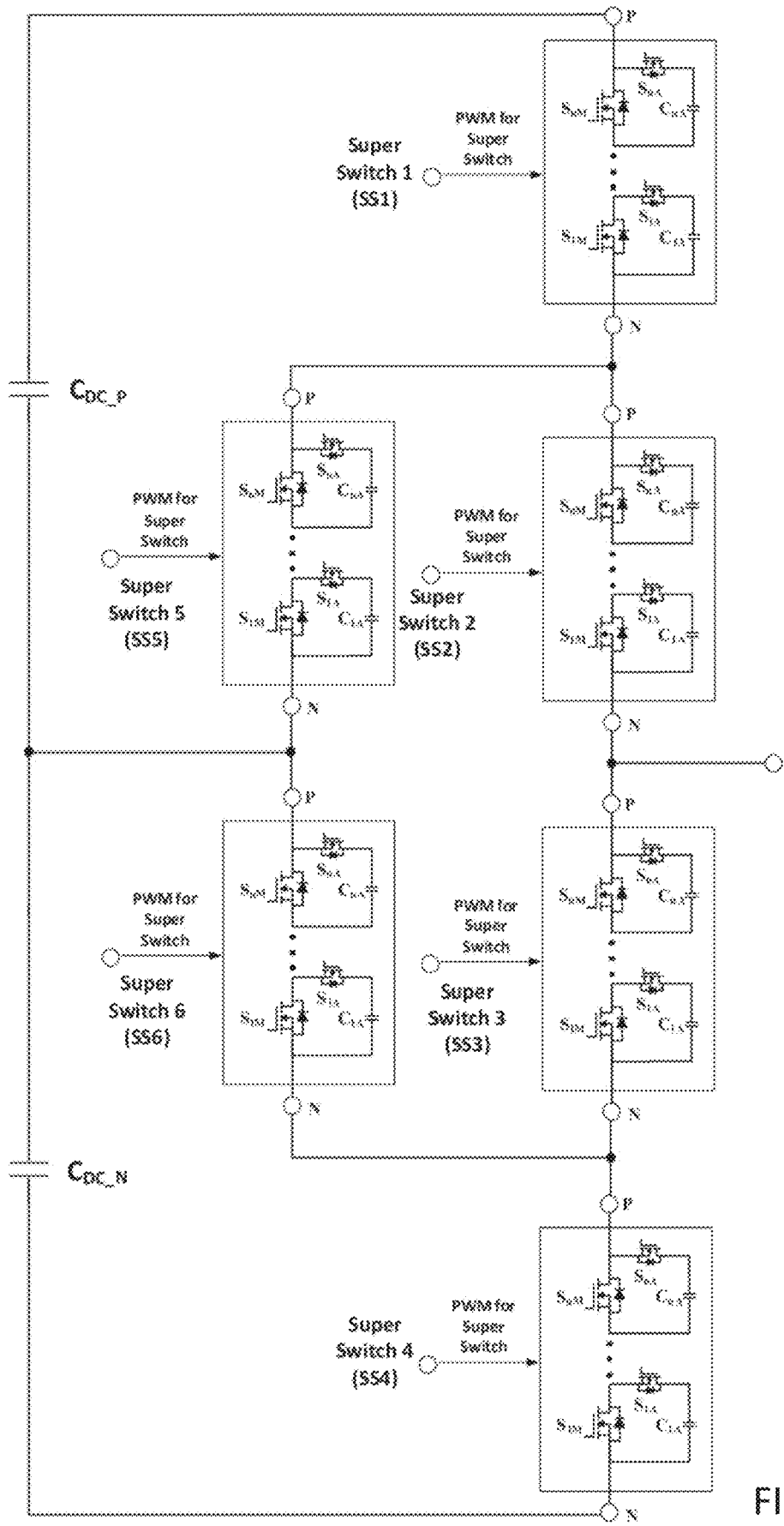
FIG. 23 illustrates a 3-level active neutral point clamp converter using two-quadrant super switches in accordance with an embodiment of the present disclosure.
Figure 24:
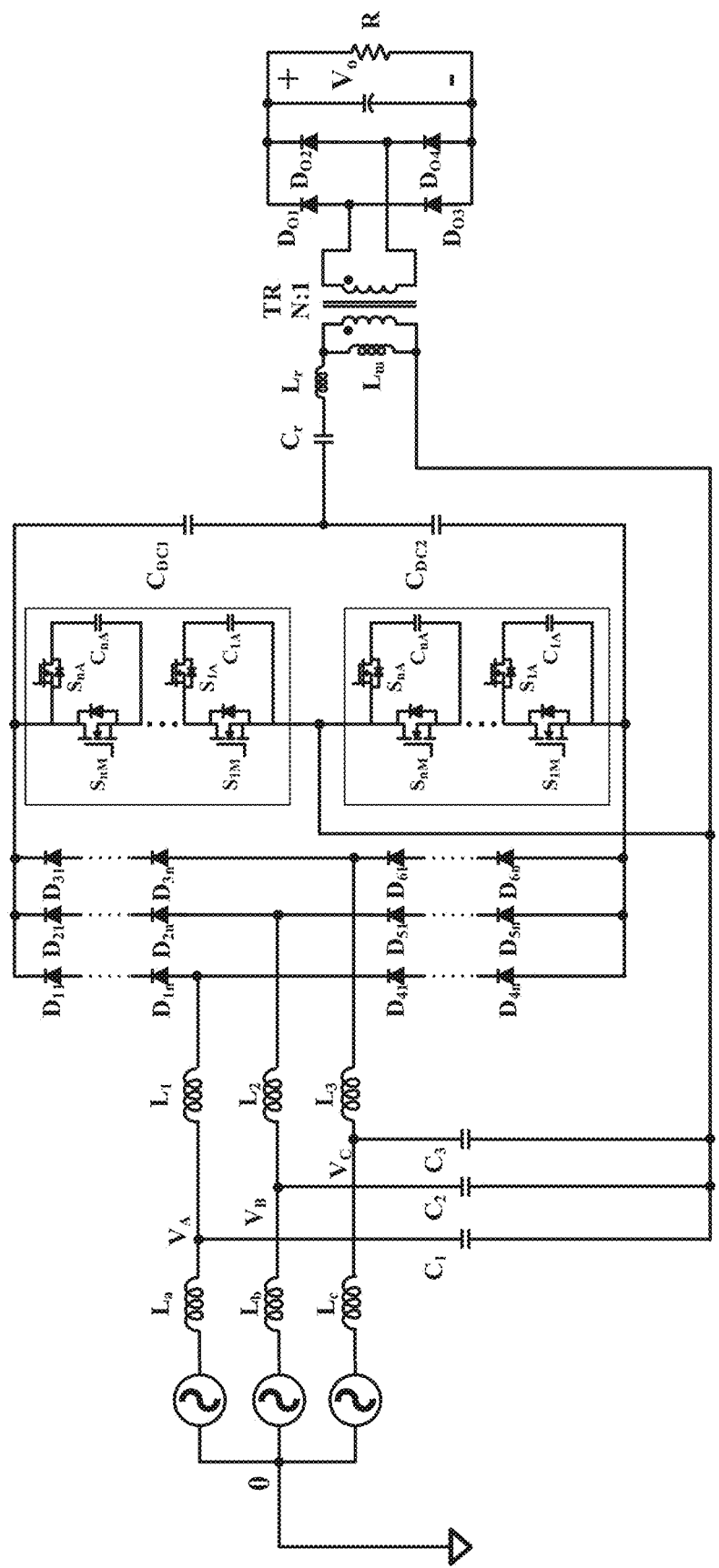
FIG. 24 illustrates a Taipei rectifier using two-quadrant super switches in accordance with an embodiment of the present disclosure.

FIG. 17 illustrates a control algorithm in accordance with an embodiment of the present disclosure. FIG. 18 illustrates a balancing scheme for the control algorithm shown in FIG. 17. Referring to FIGS. 17 and 18, in one embodiment, a Q2L generation module 1710 generates delay time $t_{d1}$, $t_{d2}$, $t_{d3}$, $t_{d4}$, $t_{d5}$, and $t_{d6}$, as shown in FIGS. 15A and 15B, based on a PWM signal for upper super switches of half bridge 1400 of FIG. 14. A rotation sequence module 1720 generates a rotating sequence of signals P1M, P2M, P3M, and P4M based on delay time $t_{d1}$, $t_{d2}$, $t_{d3}$, $t_{d4}$, $t_{d5}$, and $t_{d6}$. Signals P1M, P2M, P3M, and P4M are then fed into cells 1410_1 . . . 1410_4 of half bridge 1400. The voltage $V_C$ of each cell is sensed and compared with a reference voltage $V_{C\_ref}$. The voltage difference is sent to a controller 1730 to generate the duty cycle difference ΔD to tune the duty cycle for each cell. To achieve correct behavior, the output current polarity $I_O$ (or $I_{out}$) also needs to be sensed and applied. If $V_C$ is greater than $V_C$ ref and $I_O$ is greater than zero, then the voltage difference ΔD should be negative and subtracted from main duty cycle given through the PWM control terminal. If $V_C$ is greater than $V_{C\_ref}$ and $I_O$ is not greater than zero, then the voltage difference ΔD should positive and added to the main duty cycle given through the PWM control terminal. If $V_C$ is not greater than $V_{C\_ref}$ and $I_O$ is not greater than zero, then the voltage difference ΔD should negative and subtracted from the main duty cycle given through the PWM control terminal. If $V_C$ is not greater than $V_{C\_ref}$ and $I_O$ is greater than zero, then the voltage difference ΔD should positive and added to the main duty cycle given through the PWM control terminal.

Figure 20:
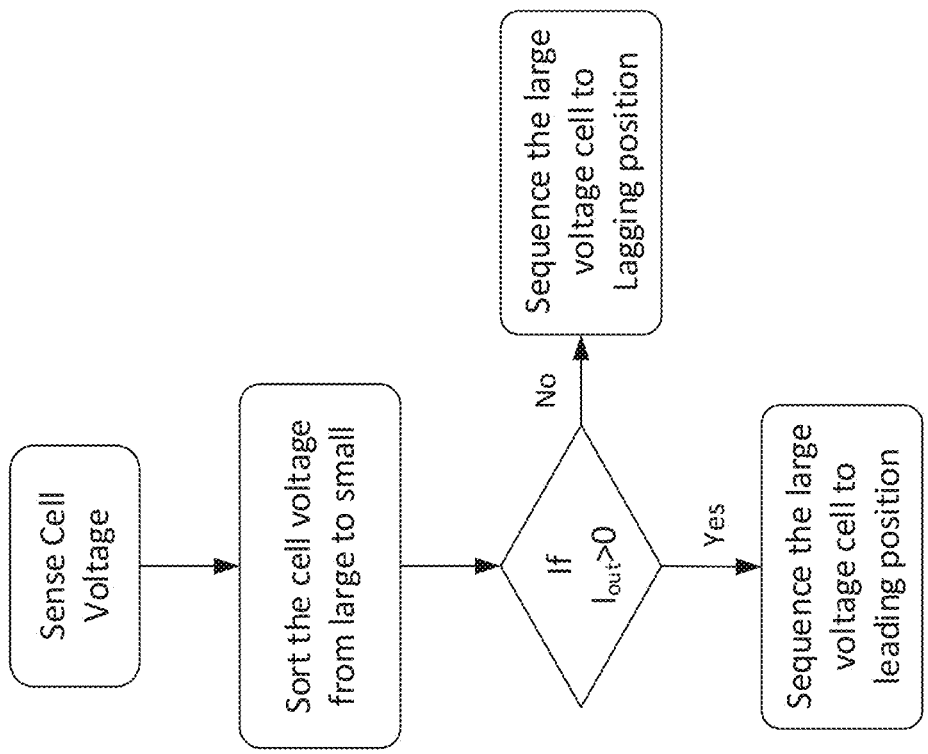
FIG. 20 illustrates a balancing scheme for the control algorithm shown in FIG. 19.

FIG. 19 illustrates a control algorithm in accordance with another embodiment of the present disclosure. FIG. 20 illustrates a balancing scheme for the control algorithm shown in FIG. 19. In this embodiment, the sequence of leading and lagging is utilized to balance cell voltages. As a result, no sequence rotating is required. All the cell voltages are sensed and sorted in sequence. With the load current polarity, the cell in leading or lagging position can be determined according to the cell voltages.

Referring to FIGS. 19 and 20, a Q2L generation module 1810 generates delay time $t_{d1}$, $t_{d2}$, $t_{d3}$, $t_{d4}$, $t_{d5}$, and $t_{d6}$, as shown in FIGS. 15A and 15B, based on a PWM signal for super switch 1400 of FIG. 14. A sequence controller 1820 generates a sequence of leading and lagging $U_{c1} \ldots U_{cn}$ utilized to balance cell voltage. Accordingly, no sequence rotating is required and no duty cycle control is required as well. All the cell voltages are sensed and then sorted from large to small in sequence. With the load current polarity $I_O$ (or $I_{out}$), the cell in leading or lagging position can be determined according to the cell voltages. If $I_O$ is greater than zero, then sequence the large voltage cell to a leading position; otherwise, sequence the large voltage cell to a lagging position.

Because of the modular solution, the switching loop impedance for each cell can be well maintained and thus the switching loss of the disclosed solution can be quite small even in hard switching applications. The present disclosure provides a building block solution and can be extended to other applications, such as multilevel converter, such as those shown in FIGS. 21 through 24.

For the purposes of describing and defining the present disclosure, it is noted that terms of degree (e.g., "substantially," "slightly," "about," "comparable," etc.) may be utilized herein to represent the inherent degree of uncertainty that may be attributed to any quantitative comparison, value, measurement, or other representation. Such terms of degree may also be utilized herein to represent the degree by which a quantitative representation may vary from a stated reference (e.g., about 10% or less) without resulting in a change in the basic function of the subject matter at issue. Unless otherwise stated herein, any numerical value appearing in the present disclosure are deemed modified by a term of degree (e.g., "about"), thereby reflecting its intrinsic uncertainty.

Although various embodiments of the present disclosure have been described in detail herein, one of ordinary skill in the art would readily appreciate modifications and other embodiments without departing from the spirit and scope of the present disclosure as stated in the appended claims.

What is claimed is:

1. A high voltage device, comprising:
a plurality of modular cells, each comprising a first terminal, a second terminal, and a control terminal, wherein the modular cells are connected in series, such that the first terminal of one of the modular cells is connected to the second terminal of a neighboring one of the modular cells, and each of the modular cells comprises a plurality of low voltage semiconductor devices and one or more low voltage passive components; and
a control unit, configured to transmit a control signal to the control terminal of each of the modular cells, wherein the control signal is shifted by a delay time for a respective one of the modular cells, the control unit comprises a level generation module and a sequence controller, the level generation module is configured to generate the delay time based on a PWM signal of a respective one of the modular cells, the sequence controller is configured to generate a duty cycle or a sequence position of the control signal of the plurality of modular cells according to cell voltages of the plurality of modular cells and an output current polarity of the high voltage device.

2. The high voltage device of claim 1, wherein said one or more low voltage passive components comprises a capacitor.

3. The high voltage device of claim 1, wherein said plurality of low voltage semiconductor devices comprises at least two power MOSFETs.

4. The high voltage device of claim 1, wherein each of the modular cells is a current-bidirectional two-quadrant switch.

5. The high voltage device of claim 4, wherein the current-bidirectional two-quadrant switch comprises a main active switch, an auxiliary active switch, and a capacitor connected to form a circuit loop, wherein a first point between the main active switch and the auxiliary active switch is connected to the first terminal and a second point between the main active switch and the capacitor is connected to the second terminal.

6. The high voltage device of claim 4, wherein the current-bidirectional two-quadrant switch comprises a first circuit loop connected to the first terminal and a second circuit loop connected to the second terminal, wherein the first circuit loop includes a first main active switch, a first auxiliary switch, and a first capacitor connected in series, and the second circuit loop includes a second main active switch, a second auxiliary switch, and a second capacitor connected in series, and wherein a first point of the first circuit loop between the first main active switch and the first capacitor is connected to a second point of the second circuit loop between the second auxiliary switch and the second capacitor.

7. The high voltage device of claim 1, wherein each of the modular cells is a four-quadrant switch.

8. The high voltage device of claim 7, wherein the four-quadrant switch comprises first, second, and third circuit legs connected in parallel between the first and second terminals, the first circuit leg comprising a first auxiliary switch and a first capacitor connected in series, the second circuit leg comprising a first main switch and a second main switch connected in series, and the third circuit leg comprising a second auxiliary switch and a second capacitor connected in series.

9. The high voltage device of claim 8, wherein sources of the first and second main switches are connected with each other.

10. The high voltage device of claim 9, wherein the four-quadrant switch comprises a first circuit loop connected to the first terminal and a second circuit loop connected to the second terminal, wherein the first circuit loop includes a first main active switch, a first auxiliary switch, and a first capacitor connected in series, and the second circuit loop includes a second main active switch, a second auxiliary switch, and a second capacitor connected in series, and wherein a first point of the first circuit loop between the first main active switch and the first capacitor is connected to a second point of the second circuit loop between the second main active switch and the second capacitor.

11. A high voltage half bridge device, comprising:
first, second, and third terminals;
a top arm connected between the first terminal and the second terminal, the top arm comprising a first quantity of low voltage modular cells connected in a cascaded form;
a bottom arm connected between the first terminal and the third terminal, the top arm comprising a second quantity of low voltage modular cells connected in a cascaded form,
wherein the second quantity is equal to the first quantity; and
a control unit, configured to transmit a control signal to the control terminal of each of the low voltage modular cells, wherein the control signal is shifted by a delay time for a respective one of the low voltage modular cells, the control unit comprises a level generation module and a sequence controller, the level generation module is configured to generate the delay time based on a PWM signal of a respective one of the low voltage modular cells, the sequence controller is configured to generate a duty cycle or a sequence position of the control signal of the plurality of low voltage modular cells according to cell voltages of the plurality of low voltage modular cells and an output current polarity of the high voltage device.

12. The high voltage half bridge device of claim 11, wherein each of first and second quantities of the modular cells is a current-bidirectional two-quadrant switch.

13. A method for controlling the high voltage device of claim 1, the method comprising:
transmitting a control signal to the control terminal of each of the modular cells, the control signal being shifted by a delay time for a respective one of the modular cells; and
sensing cell voltages of the modular cells and an output current polarity of the high voltage device;
generating the delay time based on a PWM signal of a respective one of the modular cells;
generating a duty cycle or a sequence position of the control signal of the plurality of modular cells according to the cell voltages of the plurality of low voltage modular cells and the output current polarity; and
outputting the control signal to each of the modular cells according to the duty cycle or the sequence position to balance the cell voltages of the modular cells.

14. The method of claim 13, wherein generating the duty cycle or the sequence position of the control signal of the plurality of modular cells according to the cell voltages of the plurality of low voltage modular cells and the output current polarity comprises, for each of the modular cells:
determining a voltage difference by comparing a respective one of the cell voltages with a reference voltage;
determining a duty cycle difference based on the voltage difference; and
modifying a duty cycle of the control signal for a respective one of the modular cells by the duty cycle difference.

15. The method of claim 14, wherein modifying the duty cycle comprises:
subtracting the duty cycle difference from the duty cycle, if said respective one of the cell voltages is greater than the reference voltage and the output current polarity is greater than zero, and if said respective one of the cell voltages is not greater than the reference voltage and the output current polarity is not greater than zero; and adding the duty cycle different to the duty cycle, if said respective one of the cell voltages is greater than the reference voltage and the output current polarity is not greater than zero, and if said respective one of the cell voltages is not greater than the reference voltage and the output current polarity is greater than zero.

16. The method of claim 13, wherein generating the duty cycle or the sequence position of the control signal of the plurality of modular cells according to the cell voltages of the plurality of low voltage modular cells and the output current polarity comprises:

sorting the cell voltages of the modular cells from large to small in sequence;

wherein, if the output current polarity is greater than zero, one of the modular cells having a larger cell voltage than another one of the modular cells is sequenced to a leading position; and wherein, if the output current polarity is not greater than zero, one of the modular cells having a larger cell voltage than another one of the modular cells is sequenced to a lagging position.

* * * * *